US011561184B2

(12) United States Patent
Tada et al.

(10) Patent No.: US 11,561,184 B2
(45) Date of Patent: Jan. 24, 2023

(54) SUPPORT SYSTEM FOR SPECIFIED INSPECTION, SUPPORT METHOD FOR SPECIFIED INSPECTION, AND NON-TRANSITORY COMPUTER READABLE MEDIUM

(71) Applicant: HITACHI HIGH-TECH CORPORATION, Tokyo (JP)

(72) Inventors: Nobuyoshi Tada, Tokyo (JP); Shigeya Tanaka, Tokyo (JP); Minori Noguchi, Tokyo (JP); Yuusuke Oominami, Tokyo (JP); Maya Goto, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 286 days.

(21) Appl. No.: 16/651,035

(22) PCT Filed: Sep. 25, 2018

(86) PCT No.: PCT/JP2018/035393
§ 371 (c)(1),
(2) Date: Mar. 26, 2020

(87) PCT Pub. No.: WO2019/065607
PCT Pub. Date: Apr. 4, 2019

(65) Prior Publication Data
US 2020/0278303 A1  Sep. 3, 2020

(30) Foreign Application Priority Data
Sep. 27, 2017 (JP) .............................. JP2017-185951

(51) Int. Cl.
*G01N 21/90* (2006.01)
*G01N 21/88* (2006.01)
(Continued)

(52) U.S. Cl.
CPC ..... *G01N 21/9081* (2013.01); *G01N 21/8803* (2013.01); *G01N 21/8851* (2013.01);
(Continued)

(58) Field of Classification Search
CPC ........... G01N 21/9081; G01N 21/8803; G01N 21/8851; G01N 23/2076; G01N 23/2251;
(Continued)

(56) References Cited

U.S. PATENT DOCUMENTS 6,072,178 A * 6/2000 Mizuno .................. G01B 15/00
250/307
6,140,643 A 10/2000 Brown et al.
(Continued)

FOREIGN PATENT DOCUMENTS

JP 2002-181828 A 6/2002
JP 2003-107022 A 4/2003
(Continued)

OTHER PUBLICATIONS

Extended European Search Report received in corresponding European Application No. 18862717.8 dated Jun. 9, 2021.
(Continued)

*Primary Examiner* — David P Porta
*Assistant Examiner* — Fani Polyzos Boosalis
(74) *Attorney, Agent, or Firm* — Mattingly & Malur, PC

(57) ABSTRACT

The purpose of the present invention is to increase accuracy of a specific test using an electronic microscope and improve work efficiency. Provided is a system that identifies test recipe information corresponding to an object to be tested on the basis of attribute information about a testing sample, and analyzes and evaluates the object to be tested contained in the testing sample by checking image data and element analysis data that are acquired by a measuring device in accordance with a control program for the test recipe infor-
(Continued)

mation, against reference image data and reference element analysis data that are used as evaluation references for the object to be tested.

14 Claims, 10 Drawing Sheets

(51) Int. Cl.
  *G01N 23/2251* (2018.01)
  *G06N 3/08* (2006.01)
  *G01N 23/207* (2018.01)
(52) U.S. Cl.
  CPC ..... *G01N 23/2076* (2013.01); *G01N 23/2251* (2013.01); *G06N 3/08* (2013.01); *G01N 2021/8867* (2013.01); *G06T 2207/10116* (2013.01)
(58) Field of Classification Search
  CPC .............. G01N 2021/8867; G06N 3/08; G06T 2207/10116
  See application file for complete search history.

(56) References Cited

U.S. PATENT DOCUMENTS

| | | | |
|---|---|---|---|
| 7,526,408 | B2 | 4/2009 | Mitsui |
| 8,779,357 | B1 | 7/2014 | Miller |
| 2002/0099573 | A1 | 7/2002 | Koguchi et al. |
| 2003/0118149 | A1 | 6/2003 | Okuda et al. |
| 2004/0158409 | A1 | 8/2004 | Teshima et al. |
| 2005/0256669 | A1 | 11/2005 | Mitsui |
| 2008/0125648 | A1 | 5/2008 | Bi et al. |
| 2013/0283227 | A1 | 10/2013 | Sakai et al. |
| 2014/0319344 | A1 | 10/2014 | Miller |
| 2017/0194126 | A1 | 7/2017 | Bhaskar et al. |
| 2017/0200290 | A1 | 7/2017 | Bhattiprolu et al. |

FOREIGN PATENT DOCUMENTS

| | | |
|---|---|---|
| JP | 2003-149248 A | 5/2003 |
| JP | 2003-166954 A | 6/2003 |
| JP | 2005-233658 A | 9/2005 |
| JP | 2005-317848 A | 11/2005 |
| JP | 2006-506816 A | 2/2006 |
| JP | 2006-074065 A | 3/2006 |
| JP | 2010-025836 A | 2/2010 |
| JP | 2012-156410 A | 8/2012 |
| JP | 2014-182123 A | 9/2014 |
| KR | 10-2010-0041120 A | 4/2010 |
| WO | 2004-044596 A2 | 5/2004 |
| WO | 2015/037157 A1 | 3/2015 |

OTHER PUBLICATIONS

International Search Report of PCT/JP2018/035393 dated Jan. 8, 2019.
International Preliminary Report on Patentability received in corresponding International Application No. PCT/JP2018/035393 dated Apr. 9, 2020.

* cited by examiner

SUPPORT SYSTEM FOR SPECIFIED INSPECTION, SUPPORT METHOD FOR SPECIFIED INSPECTION, AND NON-TRANSITORY COMPUTER READABLE MEDIUM

TECHNICAL FIELD

The present invention pertains to a support system for specified inspection involving use of analytical instruments instanced by an electron microscope, a support method for the specified inspection, and a program.

BACKGROUND ART

Hitherto known are sample inspections (which will hereinafter be also termed "specified inspections") involving use of electron microscopes in a variety of fields instanced by physics, chemistry, engineering, biology and medical science. The electron microscopes are exemplified by a Scanning Electron Microscope (SEM), a Transmission Electron Microscope (TEM) and a Scanning Transmission Electron Microscope (STEM). An optical microscope uses mainly visible beams of light for observing a shape of the sample, and, by contrast, the electron microscope employs electron beams, which are shorter in wavelength than the visible beams of light, for observing the shape of the sample. Therefore, an inspection using the electron microscope enables the shape of the sample to be observed based on captured images with high resolutions as compared with the inspection using the optical microscope, and also enables microstructures on a nanometer basis to be specified, the microstructures being instanced by viruses contained in the sample, in which this specifying work was difficult so far to be attained by, e.g., the optical microscopes.

The electron microscope is combined with, e.g., an Energy Dispersive X-ray spectrometry (EDX: Energy Dispersive X-ray spectrometry) as an incidental equipment. The Energy Dispersive X-ray spectrometry (which will hereinafter be abbreviated to the "EDX") is an apparatus configured to specify elements contained in a sample on the basis of characteristic X-rays generated due to electron beams with which an analysis target area of the sample is irradiated. The electron microscope is combined with the EDX, thereby enabling a qualitative analysis of an inspection object (harmful substances, foreign matters, bacteria, and other equivalent substances) based on a high-resolution captured image and a quantitative analysis based on a characteristic X-rays intensity distribution, with the result that inspection accuracy of the specified inspection is improved.

The qualitative analysis and the quantitative analysis of the sample, which involve using the electron microscope, enable evaluation inspection of the foreign matters mixed in the course of manufacturing, e.g., a semiconductor chip, a wafer and other equivalent semiconductor products. It is also feasible to make the evaluation inspection of the harmful substances (instanced by asbestos) contained in the sample such building materials collected from a dismantling field and the evaluation inspection of tissues contained in the sample such as cells collected from a medical field.

It is to be noted that the following patent document exists as a document of the prior art, in which to describe a technology related to a technology to be described in this specification.

DOCUMENTS OF PRIOR ART

Patent Document

[Patent Document 1] Japanese Patent Application Laid-Open Publication No. 2012-156410

SUMMARY OF THE INVENTION

Problems to be Solved by the Invention

By the way, in the specified inspection described above, there is a case in which an inspector operating an electron microscope visually observes a shape of the sample on the basis of images captured with a high resolution. This is a case of inspecting, e.g., an inspection object contained in the sample.

In the case mentioned above, the inspector selects an observation target area from within the captured image (whole image) of the sample being image-captured with the high resolution in a way that increases, e.g., an observation magnification by operating the electron microscope. The inspector visually observes shapes with respect to the area, and detects an observing portion with a shape similar to the inspection object being image-captured. The inspector specifies the shape being image-captured in the observing portion as the inspection object on the basis of a characteristic X-rays intensity distribution, measured by the EDX, of the detected observing portion.

The case stated above involves iterations of selecting the area of the observation target by increasing the observation magnification with respect to the whole image of the sample being image-captured with the high resolution, visually observing the shape, and specifying the inspection object on the basis of a measurement value given by the EDX. Accordingly, a period of time is expended for an operation of specifying the inspection object from within the whole image of the sample being image-captured with the high resolution in the case of performing the specified inspection through the visual observation of the inspector. The visual observation of the shape causes a rise in work burden on the inspector operating the electron microscope, resulting in, e.g., overlooking and mis-detecting the inspection object existing within the captured image.

An increase in time related to the inspection work leads to, e.g., a rise in inspection cost related to the specified inspection using the electron microscope and a decrease in working rate of inspection equipments related to the specified inspection, which includes the electron microscope.

It is an object of the present invention, which is devised in view of such circumstances, to provide a support technology of improving working efficiency by increasing accuracy of a specified inspection using an electron microscope.

Means for Solving the Problems

The present invention is exemplified as a support system for specified inspection. The support system for specified inspection includes: a storage unit to store inspection recipe information including: at least learning data information containing reference image data serving as an evaluation standard with respect to one or more inspection objects and reference element analysis data; and a control program of a measuring device to obtain image data and element analysis data for analyzing one or more inspection objects; a unit to accept attribute information of an inspection sample with a first inspection object to be analyzed; a recipe output unit to specify first inspection recipe information associated with the first inspection object on the basis of attribute information of the inspection sample, and to output the specified first inspection recipe information to the measuring device; and an evaluation unit to perform an analysis evaluation of the first inspection object of the inspection sample by collating the image data and the element analysis data obtained by the measuring device with the reference image data and the reference element analysis data of the first inspection object according to the control program of the first inspection recipe information.

Effect of the Invention

According to the present invention, it is feasible to provide the support technology of improving the working efficiency by increasing the accuracy of the specified inspection using the electron microscope.

EMBODIMENTS

Mode for Carrying Out the Invention

A support system for specified inspections according to one embodiment will hereinafter be described with reference to the drawings. A configuration of the following embodiment is an exemplification, and the support system for specified inspections is not limited to the configuration of the embodiment.

<1. System Configuration>

Figure 1:
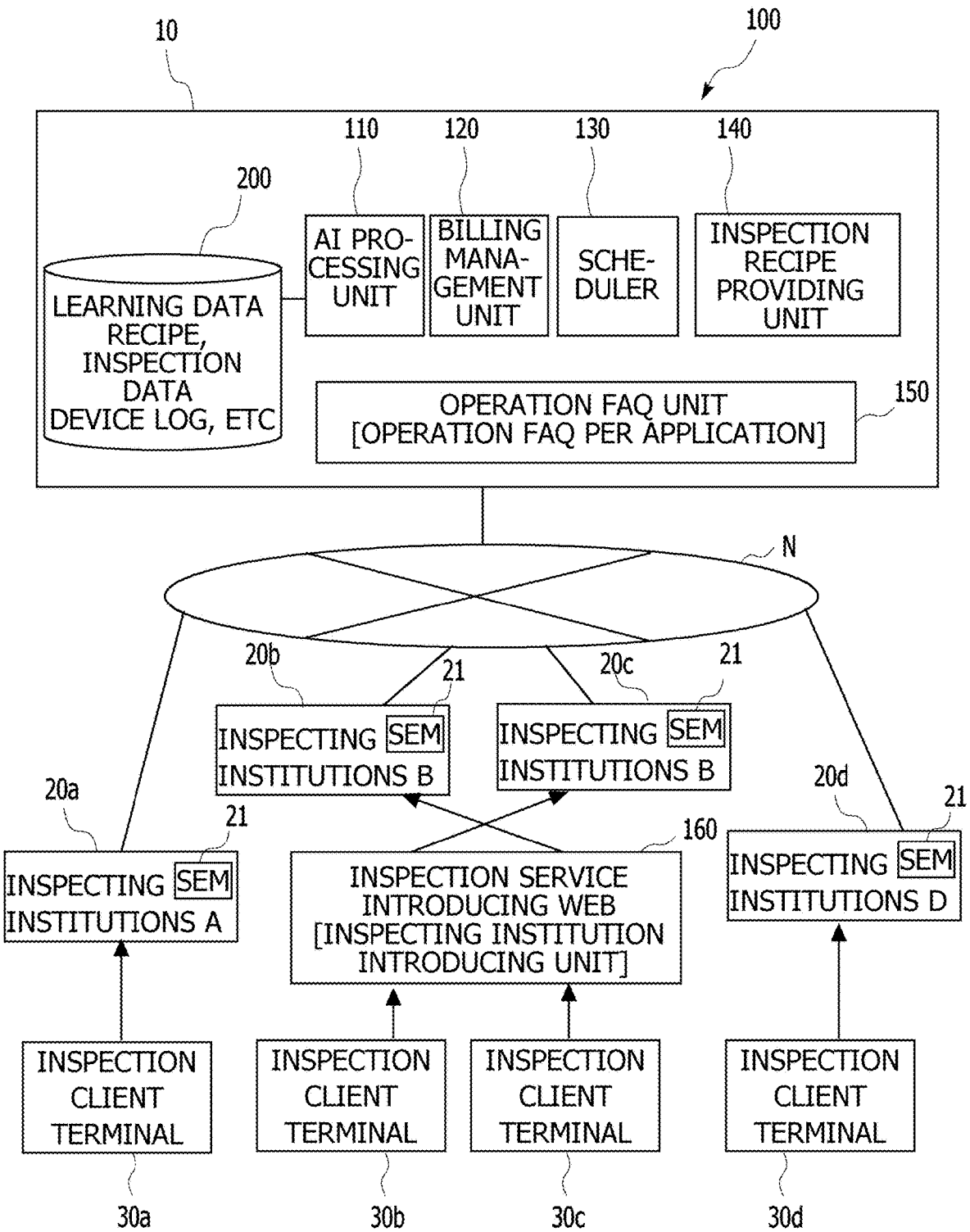
FIG. 1 is a diagram illustrating one example of a configuration of a specified inspection oriented support system according to an embodiment.

FIG. 1 is a diagram illustrating one example of a configuration of a specified inspection-oriented support system 100 according to the embodiment. In the specified inspection-oriented support system 100 illustrated in FIG. 1, an inspection support server 10 is a computer used by a support operator to support the specified inspections using an electron microscope. The "support operator" is herein defined as an operator (supplier) to provide support services for the specified inspections according to the embodiment by way of businesses, and is exemplified by a manufacturer (supplier) to sell the electron microscopes (SEM, TEM, STEM) and incidental equipments instanced by EDX (Energy Dispersive X-ray spectrometry). The support operator may, however, be an intermediator instanced by a trading company or an agent acting as an intermediary firm for selling the electron microscopes and the incidental equipments. As the case may be, an inspecting institution that makes specified inspections of a sample by use of the electron microscope may function as the support operator, or alternatively a plurality of inspecting institutions may also function, as the support operator, in cooperation with each other. Further alternatively, a plurality of enterprises each making a request for the specified inspections of the sample, which involve using the electron microscopes, may function as the support operator in some cases. Still further alternatively, in some cases, such a cooperative organization may function as to be established by the manufacturers of the electron microscopes and the incidental equipments instanced by the EDX, the intermediary firms, the inspecting institutions and any number of business operators within the enterprises making the requests for the specified inspections.

The support operator administers, e.g., a service site equipped with the inspection support server 10, and provides support services according to the embodiment to the inspecting institutions that perform the specified inspections, thereby supporting inspection tasks instanced by qualitative analysis and quantitative analysis of the samples, which involve using the electron microscopes. However, such a support mode may also be available that the support operator lends out, to the inspecting institution, an equipment unit (which will hereinafter be also termed a "specified inspection equipment unit) built up by combining the electron microscope with the incidental equipments instanced by the EDX, and then provides the support service based on the inspection support server 10. The inspecting institution rents the specified inspection equipment unit and is provided with the support service based on the inspection support server 10, thereby making it feasible to reduce equipment burdens instanced by a purchase cost related to a purchase of the specified inspection equipment unit, and a maintenance cost related to doing a maintenance-check on the specified inspection equipment unit.

The inspection support server 10 includes, at least, an inspection support database (DB) 200. The inspection support server 10 provides a variety of information processing functions, i.e., at least an AI (Artificial Intelligence) processing unit 110, a billing management unit 120, a scheduler 130, an inspection recipe providing unit 140, an operation FAQ unit 150 and an inspecting institution introducing unit 160. However, the inspection support server 10 may also be a single computer, and an aggregation of plural computers that is, e.g., a system called a "cloud" system. Similarly, the inspection support DB 200 may be built up by a single DB server or a plurality of DB servers.

In the specified inspection-oriented support system 100, the inspection support server 10 connects to a network N. The network N includes networks instanced by a public network such as the Internet, a wireless network such as a mobile phone network, a private network such as a VPN (Virtual Private Network), and a LAN (Local Area Network).

Connected to the network N are inspecting institution terminals 20a, 20b, 20c, 20d possessed by the inspecting institutions each performing the qualitative analysis and the quantitative analysis of the sample on the basis of the specified inspection. Connected further to the network N are inspection client terminals 30a, 30b, 30c, 30d possessed by inspection clients requesting the inspecting institutions for the specified inspections of the samples. Note that pluralities of terminals possessed by other unillustrated inspecting institutions and by other unillustrated inspection clients are connectable to the network N. In the following discussion, the inspecting institution terminals 20a, 20b, 20c, 20d will be generically also termed the "inspecting institution terminal 20", and the inspection client terminals 30a, 30b, 30c, 30d will be generically also termed the "inspection client terminal 30".

The inspecting institutions are institutions to perform the specified inspections of the samples provided from the inspection clients. The inspecting institutions are defined as organizations belonging to enterprises that conduct businesses in the fields of businesses instanced by civil engineering, architecture, machinery, semiconductors, home appliances, a variety of components (mechanical components, electric components, electronic components), materials, medical care, pharmaceuticals, food, biology, chemistry and engineering. The inspecting institutions are also defined as organizations belonging to universities, hospitals, municipalities, governmental agencies, and other equivalent institutions. The inspecting institutions may, however, be operators conducting the inspection service businesses related to the specified inspections of the samples, which involve using the electron microscopes.

The inspecting institution includes the inspecting institution terminal 20 used by an inspector who manipulates the electron microscope. The inspecting institution terminal 20 is an information processing apparatus instanced by a PC (Personal Computer), a WS (WorkStation) and a server. The inspecting institution terminal 20 connects to the electron microscope and the incidental equipments instanced by the EDX, then acquires captured images of the sample irradiated with electron beams, and thus measures an intensity distribution of characteristic X-rays on an analysis target region. In FIG. 1, the electron microscopes and the incidental equipments instanced by the EDX, which are connected to the inspecting institution terminals 20 are exemplified as SEMs 21. The inspector accepts, via the inspecting institution terminals 20, the support services provided by the inspection support server 10 and associated with contents, purposes, sample assortment and other equivalent items of the specified inspections.

The inspection clients are defined as client traders who request the inspecting institutions for the specified inspections of the samples. The inspection clients are the enterprises, other organizations instanced by the government agencies, affiliated companies, affiliated organizations, to which the inspecting institutions belong, or contractors or subcontractors undertaking the businesses from the enterprises and the government agencies. However, the inspecting institution is the business operator running the inspection service business related to the specified inspection, in which case individuals may be included as the inspection clients.

The inspection client has the inspection client terminal 30 instanced by the PC and the server used by a staff member, an employee, and other equivalent members of the trader making the request for the specified inspection, or used by the individual making the request for the specified inspection. The inspection client terminal 30 includes a portable information processing apparatus instanced by a mobile phone a smartphone and a tablet PC. The inspection client requests, via the inspection client terminal 30, the inspecting institution for the specified inspection of the sample provided thereto. The inspection client accepts, via the inspection client terminal 30, a result (an evaluation report based on the qualitative analysis and the quantitative analysis) of the specified inspection on the sample. The inspection client accepts, via the inspection client terminal 30, an introduction service of the inspecting institution related to the specified inspection of the sample.

In the inspection support server 10, at least learning data information, inspection data information, inspection recipe information, report information, billing management information, schedule information, operation FAQ information and inspecting institution information are stored in the inspection support DB 200.

The learning data information is information used for determining whether inspection objects (harmful substances instanced by asbestos, foreign matters, bacteria, and other equivalent substances) contained in the sample exist or not, and is basis information of the qualitative analysis and the quantitative analysis of the sample based on the specified inspection. The learning data information contains, e.g., high-resolution captured image data of the inspection object with its image being captured by the electron microscope, and the characteristic X-rays intensity distribution data of the inspection object measured by the EDX. Stored as the learning data information are the high-resolution captured image data captured based on the inspection object previously obtained as the sample by the support operator or the inspector consigned by the support operator and the characteristic X-rays intensity distribution data of the inspection object measured by the EDX.

However, the learning data information may also be extracted from within the captured image data and the intensity distribution data of the inspection object with the qualitative analysis and the quantitative analysis being completed by the inspecting institution receiving the support service of the inspection support server 10. The support operator is enabled to analyze the captured image data and the intensity distribution data accumulated as the inspection data information, extract the captured image data and the intensity distribution data, exhibiting a high correlation, of the inspection objects, and get the extracted data contained in the learning data information. An improvement of inspection accuracy of the specified inspection provided with the support service may be expected in the inspection support server 10.

The inspection support server 10 or a computer cooperating with the inspection support server 10 acquires, based on a computer program instanced by a search engine, information from Web sites related to the inspection of the inspection object, and may accumulate the acquired information as the learning data information in the inspection support DB 200. The support operator or an administrator, consigned by the support operator, of the inspection support DB 200 acquires information from within publicly-opened inspection standards (JIS standard, ISO standard, and other equivalent standards) about the inspection object, and may input the acquired information as the learning data information to the inspection support DB 200.

The inspection data information is such information that the inspecting institution receiving the support service of the inspection support server 10 performs the qualitative analysis and the quantitative analysis and accumulates the inspection data with the specified inspection being completed in the inspection support DB 200. The inspection data information includes, e.g., attribute information of the sample with the inspection request being accepted, the captured image data representing a whole image of the sample that is captured by the electron microscope, the captured image data of the inspection object specified from within the sample, and the characteristic X-rays intensity distribution data of the inspection object measured by the EDX. The attribute information of the sample is information representing features (attributes) of the sample requested for the inspection, and is exemplified by sample extraction date/time, a sample extraction place, a sample region, a sample assortment (nomenclature of member), an extractor, and an extraction quantity.

However, the captured image data, accumulated as the inspection data information, of the sample and the inspection object is provided with fixed imaging (photographing) standards (imaging (photographing) conditions). The imaging conditions are exemplified by a contrast, image brightness, an image resolution, an intensity of the electron beam, an image magnification, and an image format. The inspection support server 10 accumulates, in the inspection support DB 200, at least the sample attribute information, the captured image data of the whole image of the sample with its image being captured under the fixed imaging conditions, the captured image data of the inspection object specified from within the sample, and the characteristic X-rays intensity distribution data of the inspection object by being associated with each other.

The inspection recipe information is recommended information for supporting a process related to the specified inspection. The inspection recipe information includes a procedure till starting the specified inspection after receiving the sample, a pre-processing procedure for analyzing the inspection object contained in the sample, and an operation guide of the specified inspection equipment unit for starting the analysis of the inspection object in the sample undergoing the pre-processing. The inspection recipe information includes a device recipe, a written report creation guide (template, and other equivalent guides), and a guideline related to the specified inspection. The inspection recipe information is stored as the recommended information associated with the contents and the purpose of the specified inspection, the sample attribute information and other equivalent items in the inspection support DB 200.

In the inspection recipe information, the procedure for starting the specified inspection after receiving the sample is defined as information including a processing procedure recommended for performing the specified inspection utilizing the support service of the inspection support server 10. The procedure till starting the specified inspection after receiving the sample includes a procedure of transmitting the attribute information about the received sample to the inspection support server 10.

The pre-processing procedure includes a process necessary for the sample before acquiring the captured image data by using the electron microscope, e.g., an execution procedure of processes instanced by grinding, heating, melting and immersing in an acid solution or other equivalent solutions, and obtaining supernatants and infranatants by centrifuge separation. The operation guide of the specified inspection equipment unit includes an operation procedure with respect to the specified inspection equipment unit till starting the specified inspection after setting up the sample undergoing the pre-processing on the electron microscope. A start of the specified inspection is triggered by starting up the computer program specified in, e.g., the device recipe.

The device recipe is defined as an aggregation of the computer programs with an operation sequence being stipulated for specifying the inspection object contained in the sample that is set up on the electron microscope. The device recipe includes a control program of the electron microscope to capture the image of the sample, set up on the electron microscope according to the imaging conditions, as the captured image data, and a control program of the electron microscope scanning the whole image of the sample by increasing an observing magnification. The device recipe further includes a control program to measure a characteristic X-rays intensity distribution of an observing region, of which a shape similar to the inspection object is image-captured. Obtained in the specified inspection equipment unit are the captured image data related to the qualitative analysis and the quantitative analysis of the inspection object contained in the sample and the characteristic X-rays intensity distribution data under the control stipulated in the device recipe.

The written report creation guide includes information used for the inspector to create a written inspection report on the basis of evaluation results of the qualitative analysis and the quantitative analysis of the sample, which are transmitted from the inspection support server 10. The items of information for creating the written inspection report are, e.g., a written report format according to the inspection standards (JIS standard, ISO standard, and other equivalent standards), the contents of the evaluation results applied to the written report format, and indications of applied items within the written report format. The administrator, consigned by the support operator, of the inspection support DB 200 acquires the information from within the publicly-opened inspection standards of the inspection object, and inputs, based on the acquired information, the written report creation guide to the inspection support DB 200.

Report information of the inspection support DB 200 is defined as format information for reporting the evaluation results of the qualitative analysis and the quantitative analysis of the sample with the specified inspection of the inspection support server 10 being completed. The report information is stored in the inspection support DB 200 as the format information associated with the contents and the purpose of the specified inspection, the attribute information of the sample, and other equivalent items. The report information is registered in the inspection support DB 200 similarly to the written report creation guide.

The billing management information is information for managing the billing on the inspecting institution receiving the specified inspection oriented support service of the inspection support server 10. The billing management information includes a charge system of the support service provided from the inspection support server 10, identifying information of the inspecting institution provided with the support service, a contract period, usage time, a usage count, a payment account, and other equivalent items. The billing management information further includes a support service providing mode (e.g., lending-out of specified inspection equipment unit+providing of support service application, and providing of support service application), identifying information of the lent-out specified inspection equipment unit, a MAC (Media Access Control) address of the inspecting institution terminal 20 connected to the specified inspection equipment unit. Note that in a mode of being limited to the providing of the support service application, the billing management information includes a model and a serial number of the specified inspection equipment unit equipped in the inspecting institution, a MAC address of the information processing apparatus functioning as the inspecting institution terminal 20, and other equivalent items. It is to be noted that the charge system may be sorted out corresponding to, e.g., the support service providing mode, the usage time, the usage count, and other equivalent items. The support operator or the administrator, consigned by the support operator, of the inspection support DB 200 registers the billing management information in the inspection support DB 200 on the basis of the support service providing mode.

The schedule information is information for managing the usage time per specified inspection equipment unit lent out to the inspecting institution. The schedule information includes identifying of the inspecting institution, representative contact information of the inspecting institution, identifying information of the specified inspection equipment unit lent out to the inspecting institution, a lent-out period of the specified inspection equipment unit, and other equivalent items. Similarly to the billing management information, the schedule information is registered in the inspection support DB 200.

The operation FAQ information is information into which FAQs of the specified inspection oriented support services provided via the service site administered by the support operator are integrated. The operation FAQ information includes, the support service providing mode, an outline of the specified inspection equipment unit to be lent out, examples of the specified inspections, the representative contact information of the support operator, and other equivalent items. The operation FAQ information may further include an operation guide of the specified inspection equipment unit that is provided to the inspecting institution provided with the support service, explanations of technical terms, troubleshooting methods, and other equivalent items. The support operator or the administrator, consigned by the support operator, of the inspection support DB 200 registers the operation FAQ information in the inspection support DB 200. Alternatively, the inspection support server 10 or the computer cooperating with the inspection support server 10 acquires items of information about which the inspecting institution and the inspection clients make queries through the computer program, and may also accumulate the acquired items of information in the inspection support DB 200.

The inspecting institution information is information for introducing the inspecting institution that provides the specified inspection service. The inspecting institution information includes, with respect to every inspecting institution, a name, a location address, representative contact information, an outline of the specified inspection equipment unit, past records of the inspections, applicable fields, and other equivalent items. For example, the inspecting institution receiving the specified inspection oriented support service of the inspection support server 10 is registered in the inspecting institution information. However, the inspection support server 10 or the computer cooperating with the inspection support server 10 acquires items of information from the Web site related to the inspection of the inspection object via the computer program instanced by the search engine, and may also accumulate the acquired items of information as the inspecting institution information in the inspection support DB 200 The support operator or the administrator, consigned by the support operator, of the inspection support DB 200 may also input items of information distributed, disclosed and publicly opened from the respective inspecting institutions to the inspection support DB 200.

In the specified inspection oriented support system 100 according to the embodiment, the inspection support server 10 provides the inspection recipe information related to the specified inspections on the basis of the information accumulated in the inspection support DB 200, the information (the contents and the purposes of the specified inspections, the attribute information of the samples, and other equivalent items) transmitted from the inspecting institutions. The inspection recipe information is implemented via a processing function of the inspection recipe providing unit 140.

The inspection recipe information includes, as recommended information, a procedure till starting the specified inspection after receiving the sample, a pre-processing procedure for analyzing the inspection object contained in the sample, and a specified inspection equipment unit operation guide for analyzing the inspection object contained in the sample undergoing the pre-processing. The recommended information presented from the inspection support server 10 is displayed on a display screen instanced by an LCD (Liquid Crystal Display) equipped in the inspecting institution terminal 20 via, e.g., the network N.

The inspector refers to the recommended information presented on, e.g., the display screen, and is thereby enabled to execute the pre-processing needed for performing the specified inspection on the sample provided from the inspection client. The inspector sets up the sample undergoing the pre-processing in the electron microscope, and is thereby enabled to operate the specified inspection equipment unit till starting the specified inspection.

Provided as the inspection recipe information is a device recipe defined as an aggregation of the computer programs in which to stipulate operation sequences for specifying the inspection objects contained in the set-up sample by controlling the specified inspection equipment unit. The electron microscope and the EDX each connected to the inspecting institution terminal 20 are automatically controlled by the control program included in the device recipe, thereby obtaining the captured image data concerning the qualitative analysis and the quantitative analysis and the intensity distribution data of the inspection object contained in the sample. Various types of obtained data are transmitted to the inspection support server 10 via the network N.

Figure 2:
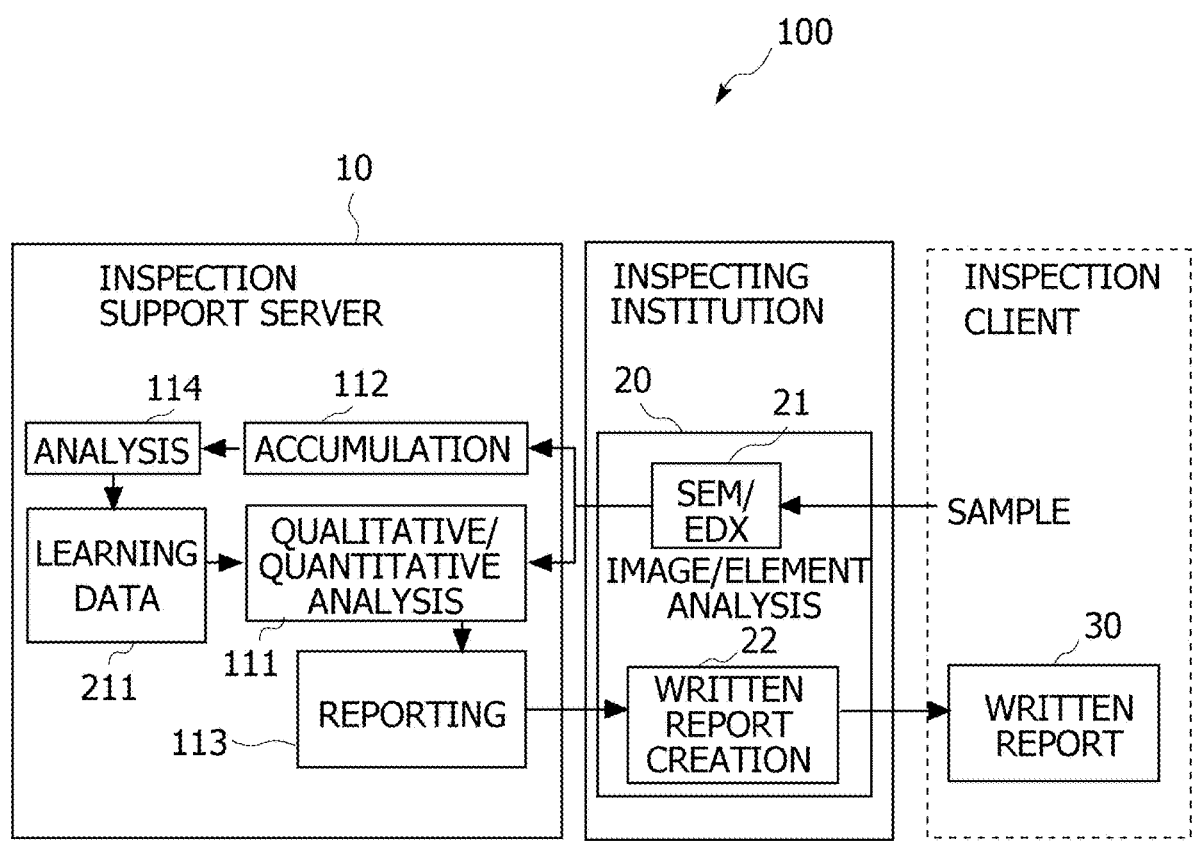
FIG. 2 is an explanatory diagram illustrating a processing flow related to a qualitative analysis and a quantitative analysis of an inspection object according to the embodiment.

FIG. 2 is an explanatory diagram illustrating a processing flow related to the qualitative analysis and the quantitative analysis of the inspection object provided by the inspection support server 10. The inspection support server 10 receives the captured image data and the characteristic X-rays intensity distribution data, which are transmitted from the specified inspection equipment unit (SEM/EDX 21) controlled by the computer program of the device recipe.

In the inspection support server 10, a qualitative analysis/quantitative analysis (qualitative/quantitative analysis 111) function of the inspection object contained in the sample being set up according to the inspection recipe information is provided based on the receiving captured image data and the received characteristic X-rays intensity distribution data. The qualitative analysis and the quantitative analysis of the inspection object contained in the sample are performed through a learning-based processing function of the AI processing unit 110. Note that the learning process may involve performing deep learning. The deep learning includes, e.g., a learning step of adjusting (optimizing) a coefficient of a convolution operation to process sample images by inputting a multiplicity of pairs of multiple sample images and correct answer data indicating where asbestos exist in the sample images, and a cognitive step of inputting, after completing the learning step, sample images of an unknown sample, processing the inputted images by the convolution operation, extracting the images specifying the asbestos regions, and cognizing where the asbestos exist in the sample images of the unknown sample.

The inspection support server 10 may specify the observing region, of which a shape similar to the inspection object is image-captured, by calculating a correlation between the captured image data of the sample and known learning data 211. To be specific, the inspection support server 10 checks the captured image data of the sample being image-captured under, e.g., predetermined imaging conditions against the known learning data 211, stored in the inspection support DB 200, of the inspection object, thereby specifying the observing region within the captured image, of which the shape similar to the inspection object is image-captured. The known learning data 211 used when specifying the observing region is, e.g., reference image data representing the shape of the inspection object.

The inspection support server 10 further checks, e.g., the characteristic X-rays intensity distribution measured by the EDX with respect to the observing region against the known learning data 211 of the inspection object, which is stored in the inspection support DB 200, thereby specifying the shape being image-captured in the observing region as the inspection object. The learning data used when specifying the shape being image-captured in the observing region as the inspection object (e.g., the asbestos, specific bacteria, and other equivalent objects) is, e.g., the characteristic X-rays intensity distribution data of the inspection object.

Note that the inspection support server 10 makes an analysis 114 of the shape being image-captured by the SEM of the SEM/EDX 21, then collates and compares with the reference image data, representing the shape of the inspection object, of the known learning data 211, and is thereby enabled to specify the inspection object, in which case the inspection object may be specified without the measurement by the EDX. When the inspection object is not specifiable or is hard to be specified from the shape being image-captured by the SEM as a result of collating and comparing the shape being image-captured by the SEM with the reference image data of the known learning data 211, the inspection support server 10 specifies an observing region to be observed, which is not specifiable or is hard to be specified. When the observing region is specifiable, this observing region may be measured by the EDX of the SEM/EDX 21, and a measured result of the EDX may be analyzed by the qualitative/quantitative analysis 111.

The inspection support server 10, through the deep learning by the A1 processing unit 110 or the processing function based on correlation calculations, performs the collation about the whole image of the image-captured sample, and measures a number of individual pieces of the specified inspection object, sizes (lengths) of the respective individual pieces, and other equivalent values thereof.

Created, based on the measured number of individual pieces of the specified inspection object, the measured sizes (lengths) of the respective individual pieces and other equivalent values thereof in the sample, are evaluation results (reporting 113) of the qualitative analysis and the quantitative analysis, which include items of information instanced by a distribution state per percentage content and per size of the individual piece of the inspection object in the sample. The evaluation results are created based on the report information stored in the inspection support DB 200. The evaluation results created by using a format (template) associated with the contents and the purpose of the specified inspection, the attribute information of the sample and other equivalent items, are transmitted to the inspecting institution terminal 20.

As described above, the qualitative analysis/quantitative analysis process provided by the inspection support server 10 according to the embodiment involves performing the collation based on a deep learning function using the learning data information defined as the basis information. The inspection support server 10 according to the embodiment is thereby enabled to uniquely evaluate the captured image data of the sample being image-captured by the electron microscope on the basis of the fixed standard (learning data).

Figure 3:
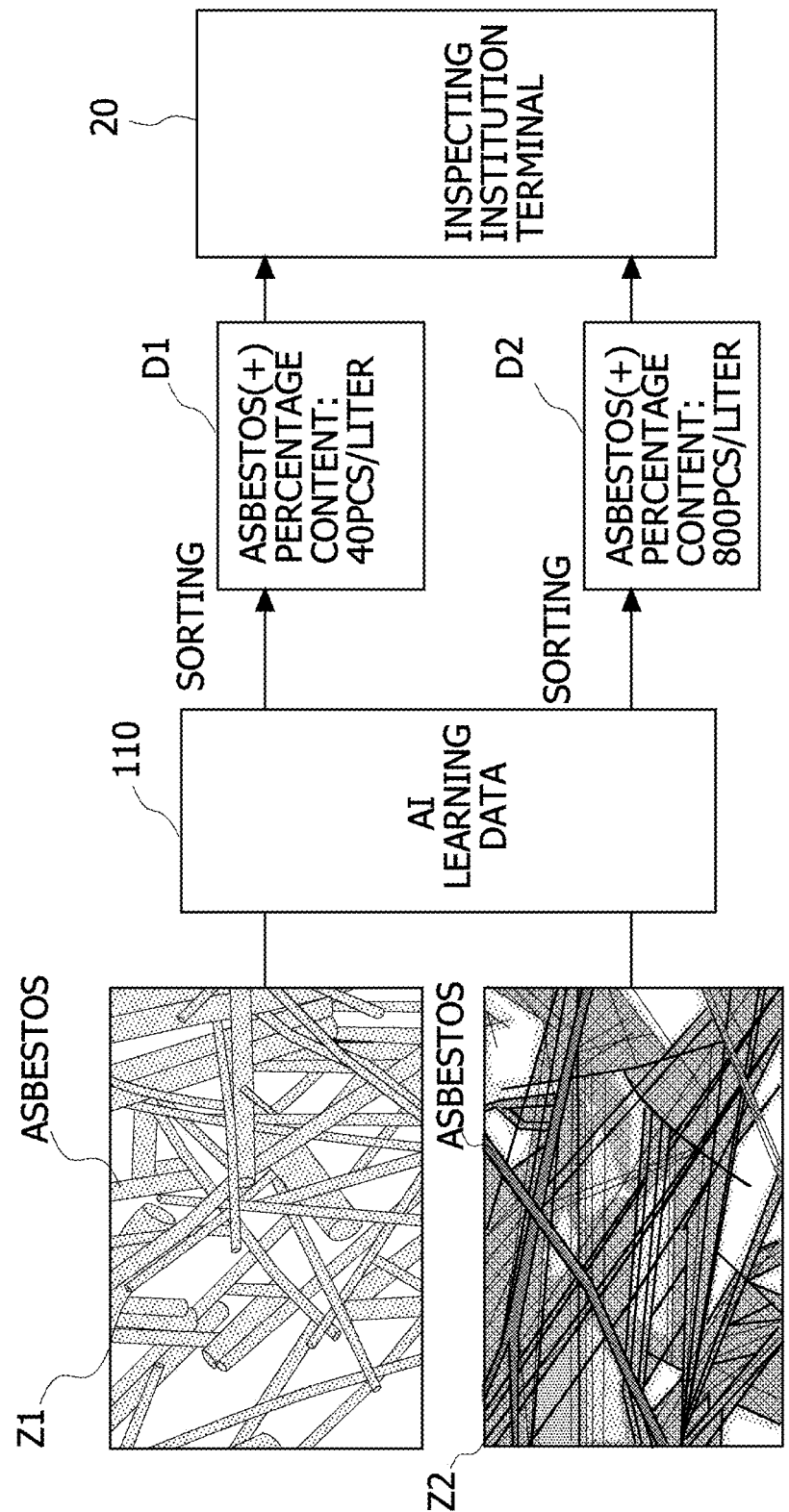
FIG. 3 is an explanatory diagram illustrating an evaluation of processes related to the qualitative analysis and the quantitative analysis of the inspection object according to the embodiment.

FIG. 3 is an explanatory diagram illustrating the evaluation of processes related to the qualitative analysis and the quantitative analysis of the inspection object by the inspection support server 10. FIG. 3 illustrates captured images (Z1, Z2) obtained by capturing the image of the sample containing the asbestos. The sample is, e.g., a ventilation filter of ventilation equipment provided at a working site of demolition of a building using building materials containing the asbestos. The specified inspection involves conducting the qualitative analysis and the quantitative analysis in such a way that the inspection object is the asbestos adhered to the ventilation filter when ventilating the demolition work site. Note that the captured images Z1, Z2 are captured images in a state where the ventilation filter provided as the sample receives the pre-processing according to the inspection recipe information.

The asbestos having acicular shapes is exemplified in each of the captured images Z1, Z2. When making a comparison between the captured images Z1, Z2, it is recognizable that the captured image Z2 has a large amount of asbestos having the acicular shapes. The process related to the qualitative analysis and the quantitative analysis provided by the inspection support server 10 involves performing the collation by the AL processing function on the basis of the reference images (learning data) of the asbestos having the acicular shapes, and evaluating the sample about which the specified inspection is requested. In the process according to the qualitative analysis and the quantitative analysis provided by the inspection support server 10, an evaluation D1 is obtained from the captured image Z1, while an evaluation D2 is obtained from the captured image Z2. Note that "asbestos (+)" in the evaluations D1, D2 represents that the asbestos defined as the inspection object is specified in the sample. "Percentage content*-number/liter" in the evaluations D1, D2 represents a ratio of the number of asbestos counted based on the learning data from the captured images Z1, Z2** to a total ventilation quantity of the ventilation equipment fitted with the ventilation filter. The total ventilation quantity is included in the information transmitted as, e.g., the attribute information of the sample from the inspecting institution.

As illustrated in FIG. 3, the inspection support server 10 performs the collation through the AI processing function using the fixed standard (learning data), and is thereby enabled to sort out the states of the inspection objects contained in the sample on the basis of the captured image data obtained by capturing the image of the sample undergoing the pre-processing. The inspection support server 10 is capable of uniquely evaluating the inspection objects contained in the sample as in the case of the evaluation D1 for the captured image Z1 and the evaluation D2 for the captured image Z2. The qualitative analysis/quantitative analysis process provided by the inspection support server 10 enables an individual difference about the evaluation between the inspectors to be restrained, the difference being caused by overlooking and mis-detecting the inspection object due to a work burden on the specified inspection.

According to the qualitative analysis/quantitative analysis process provided by the inspection support server 10, the captured image data of the sample and the characteristic X-rays intensity distribution data are obtained based on the device recipe through the automatic control of the specified inspection equipment unit. The inspection support server 10 observes the shape of the inspection object in the captured image data of the sample, specifies the inspection object on the basis of the characteristic X-rays intensity distribution, measures the number of individual pieces, the size (length) of each of the individual pieces of the inspection objects in the sample, and makes the evaluation of the specified inspection. As a result, the inspector receiving the specified inspection oriented support service is enabled to assign a period of time expended for the specified inspection to other tasks, whereby an improvement in work efficiency may be expected.

Referring back to FIG. 2, the inspection support server 10 accumulates, in the inspection support DB 200, the captured image data and the characteristic X-rays intensity distribution data received from the SEM/EDX 21 (accumulation 112). The captured image data and the characteristic X-rays intensity distribution data are accumulated as the inspection data information in the inspection support DB 200 by being associated with the attribute information of the sample, the imaging standard included in the inspection recipe information, the captured image data of the inspection object in the sample, and other equivalent items. The captured image data and the characteristic X-rays intensity distribution data are further accumulated as the inspection data information in the inspection support DB 200 by being associated with the learning data 211 used for the collation or with identifying information for identifying the learning data 211.

The inspection support server 10 analyzes, e.g., a degree of collation (correlation) of the accumulated pieces of captured image data of the sample with the inspection data information accumulated in the inspection support DB 200, in which the captured image data of the inspection object in the sample being image-captured when making the inspection is set as the reference data (analysis 114). As a result of the analysis, for example, the inspection support server 10 is enabled to reflect, in the learning data information, the captured image data, exhibiting the high correlation, of the inspection object within the accumulated pieces of inspection data information. The inspection support server 10 enables the qualitative analysis/quantitative analysis process to increase its inspection accuracy with respect to the inspection object.

However, the inspection data information accumulated in the inspection support DB 200 may be analyzed by, e.g., the support operator or the administrator, consigned by the support operator, of the inspection support DB 200, and may also be analyzed by the computer cooperating with the inspection support server 10.

Note that the inspection recipe information includes the written report creation guide. The inspector refers to the written report creation guide presented on the display screen of the inspecting institution terminal 20, and is thereby enabled to simply create the written report creation guide in which the specified inspection evaluation results transmitted from the inspection support server 10 are reflected. It is feasible to create the written report creation guide submitted from the inspection client to the municipality and other equivalent organizations without being troublesome about the contents and the purpose of the specified inspection and the assortment of the inspection standard to be adopted.

The specified inspection oriented support system 100 according to the embodiment makes it possible to provide a support technology to improve the work efficiency by increasing the accuracy of the specified inspection using the electron microscope.

<2. Configuration of Apparatus>

Figure 4:
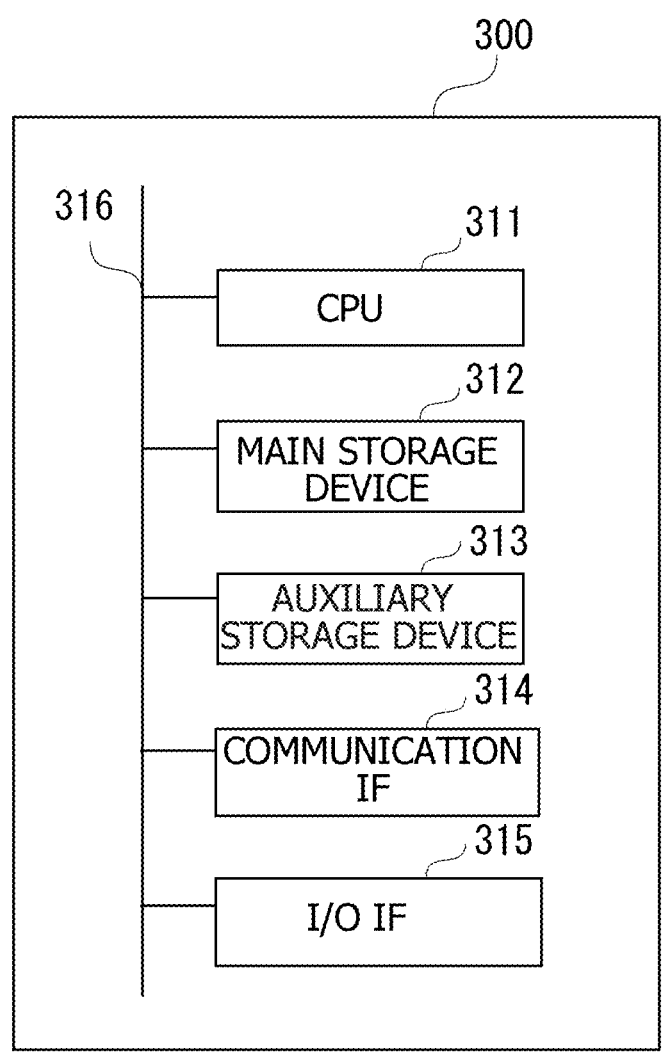
FIG. 4 is a diagram illustrating one example of a hardware configuration of a computer.

FIG. 4 is a diagram illustrating one example of a hardware configuration of the computer. Each of the inspection support server 10, the inspecting institution terminal 20 and the inspection client terminal 30 in FIG. 1 is exemplified by a configuration of a computer 300 illustrated in FIG. 4.

The computer 300 depicted in FIG. 4 includes a CPU (Central Processing Unit) 311, a main storage device 312, an auxiliary storage device 313, a communication IF (Interface) 314 and an input/output (I/O) IF 315, which are interconnected via a connection bus 316. The main storage device 312 and the auxiliary storage device 313 are recording mediums that are readable by the computer 300. Note that the components described above may be provided by pluralities, and part of the components may not be provided.

The CPU 311 is also called an MPU (Microprocessor) or a processor. It does not, however, mean that the CPU 311 is limited to the single process, and the CPU 311 may take a multiprocessor configuration. the single CPU connected by a single socket may take a multicore configuration. The CPU 311 is a central processing unit to control the whole computer 300. The CPU 311 deploys the program stored in, e.g., the auxiliary storage device 313 into a work area of the main storage device 312 in an executable manner, and provides functions matching with predetermined purposes by controlling peripheral devices through running the program. The specified inspection oriented support system 100 according to the embodiment provides respective processing functions possessed by the inspection support server 10, the inspecting institution terminal 20 and the inspection client terminal 30.

The main storage device 312 stores the computer program to be run by the CPU 311 and the data to be processed by the CPU 311. The main storage device 312 includes, a flash memory, a RAM (Random Access Memory) and a ROM (Read Only Memory). The auxiliary storage device 313 stores various categories of programs and various items of data in a readable/writable manner on a recording medium. The auxiliary storage device 313 is also called an external storage device. For example, an OS (Operating System), the various categories of programs and various types of tables are stored in the auxiliary storage device 313. The OS includes a communication interface program for transferring and receiving the data to and from external apparatuses connected via the communication IF 314. The external apparatuses include the information processing apparatuses instanced by the PC, the WS, the server and the mobile terminal, and the external storage devices, which are connected to the network N.

The auxiliary storage device 313 is used as a storage area auxiliary to the main storage device 312, and stores the computer program to be run by the CPU 311 and the data to be processed by the CPU 311. The auxiliary storage device 313 is exemplified by a silicon disk including a nonvolatile semiconductor memory (flash memory, an EPROM (Erasable Programmable ROM)), a Solid State Drive (SSD), and a Hard Disk Drive (HDD). The auxiliary storage device 313 is also exemplified by drives such as a CD (Compact Disc) drive, a DVD (Digital Versatile Disc) drive, a BD drive for detachable recording mediums. The detachable recording medium is exemplified by the CD, the DVD, the BD, a USB (Universal Serial Bus) memory, and an SD (Secure Digital) memory card.

The communication IF 314 is an interface with the network for connecting to the computer 300. In the inspection support server 10 in FIG. 10, the data is transferred and received via the communication IF 314 to and from the inspecting institution terminal 20 and the inspection client terminal 30 that are connected to the network N according to a predetermined protocol.

The I/O IF 315 is an interface for inputting and outputting the data to the devices connected to the computer 300. Connected to the I/O IF 315 are, e.g., a pointing device instanced by a keyboard, a touch panel and a mouse, and an input device instanced by a microphone. The computer 300 accepts an operation instruction and other equivalent indications from the operator who operates the input device via the I/O IF 315.

Connected further to the I/O IF 315 are, e.g., a display device instanced by an LCD (Liquid Crystal Display), an EL (Electroluminescence) panel and an organic EL panel, and an output device instanced by a printer and a loudspeaker. The computer 300 outputs via the I/O IF 315 the data and the information to be processed by the CPU 311, and the data and the information to be stored in the main storage device 312 and the auxiliary storage device 313.

The CPU 311 runs the program, whereby the inspection support server 10 in FIG. 1 provides information processing functions of, at least, the AI processing unit 110, the billing management unit 120, the scheduler 130, the inspection recipe providing unit 140, the operation FAQ unit 150 and the inspecting institution introducing unit 160. However, at least part of the processing functions may be provided by a DSP (Digital Signal Processor), an ASIC (Application Specific Integrated Circuit), a GPU (Graphics Processing Unit) and other equivalent units. Similarly, at least part of the processing functions may be dedicated LSIs (Large Scale Integrations) of the FPGA (Field Programmable Gate Array), a numerical processor, a vector processor, an image processing processor and other equivalent processors, and other digital circuits. Analog circuits may also be included in at least part of the processing functions. The inspection support server 10 includes the auxiliary storage device 313 and the inspection support DB 200 as storage locations of the data to which the respective functions refer or the data managed by the respective functions.

The CPU 311 runs a browser program, whereby the inspecting institution terminal 20 and the inspection client terminal 30 in FIG. 1 are connected to a service site being publicly opened on the Web and administered by the support operator. A variety of contents written by HTML (HyperText Markup Language) and other equivalent languages provided by the service site are displayed on the display device instanced by the LCD equipped in each terminal. Users of the respective terminals are able to use operation FAQ contents and inspecting institution introducing service contents included in the variety of contents displayed on the LCDs and provided by the service site.

The operation FAQ unit 150 of the inspection support server 10 accepts a usage request from each terminal, reads the operation FAQ information stored in the inspection support DB 200, and provides each terminal with the operation FAQ information as the operation FAQ contents. Displayed on the LCD of each terminal are the support service providing mode, the outline of the lent-out specified inspection equipment unit, the examples of the specified inspections, the representative contact information of the support operator and other equivalent items, which are included in the operation FAQ information. Further displayed on the LCD of the predetermined inspecting institution terminal 20 are the operation guide of the provided specified inspection equipment unit, the explanations of the technical terms, the troubleshooting methods and other equivalent items, which are included in the operation FAQ information.

The inspecting institution introducing unit 160 of the inspection support server 10 accepts the usage request from each terminal, reads the inspecting institution information stored in the inspection support DB 200, and provides each terminal with the inspecting institution information as the inspecting institution introducing service contents. Displayed on the LCD of each terminal are the name, the location address, the representative contact information, the outline of the specified inspection equipment unit, the past records of the inspections, the applicable fields, and other equivalent items.

<3. Processing Configuration>

The respective information processing functions of the AI processing unit 110, the billing management unit 120, the scheduler 130 and the inspection recipe providing unit 14, which are provided by the inspection support server 10, will hereinafter be described based on a mode of a support model illustrated in FIG. 5.

(AI Processing Unit 110 and Inspection Recipe Providing Unit 140)

Figure 5:
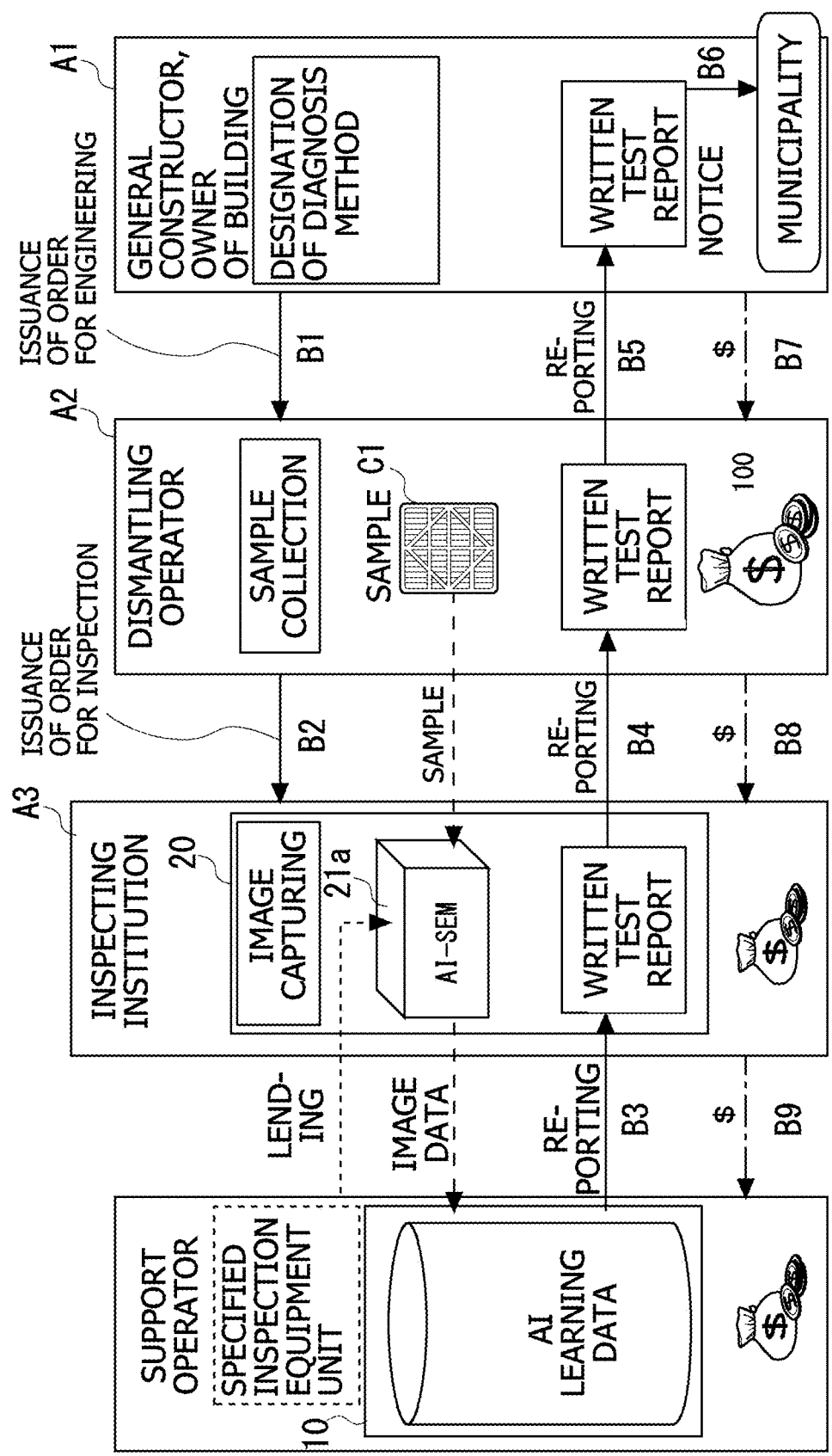
FIG. 5 is a diagram illustrating one example of a support service mode provided to an inspecting institution performing the specified inspection of asbestos.

FIG. 5 illustrates one example of the support service mode provided to the inspecting institution performing the specified inspection of the asbestos. An inspecting institution A3 depicted in FIG. 5 is provided with the support service via the respective information processing functions of the inspection support server 10 together with lending out the specified inspection equipment unit. AI-SEM21$a$ illustrated in FIG. 5 represents the specified inspection equipment unit lent out from the support operator. The specified inspection equipment unit AI-SEM21$a$ is connected to the inspecting institution terminal 20 and is thereby provided with the support service explained by using FIG. 2.

FIG. 5 illustrates such a mode that a prime contractor A1 instanced by a general constructor receives a contract of building construction such as rebuilding, which is collectively ordered by a proprietor or an owner defined as a right holder of a building, and a dismantling operator A2 receives a contract of a work to dismantle the building from the prime contractor A1. The dismantling operator A2 has the inspection client terminal 30 and is defined as the inspection client who requests the inspecting institution A3 to perform the specified inspection. The prime contractor A1 issues an order of the dismantling work to the dismantling operator A2 by designating a diagnosis method of checking whether or not the building materials used for the building contain the asbestos and specifying where the building materials containing the asbestos are used (B1).

When designing the dismantling work, the dismantling operator A2 collects a plurality of building materials from predetermined portions (wall, floor, ceiling, etc.) of the building along a diagnosing direction designated beforehand. The dismantling operator A2 submits the collected building materials as a sample C1 to the inspecting institution A3, and then issues the order of performing the specified inspection of the sample C1 to the inspecting institution A3 (B2).

The inspecting institution A3 conducts a login operation for using the support service provided by the inspection support server 10 via the inspecting institution terminal 20. The login operation is carried out by starting up and running, e.g., an application program preinstalled in the inspecting institution terminal 20. After the login, e.g., a window for inputting the contents and the purpose of the specified inspection and the information on the specified inspection object, is displayed on the display screen of the LCD of the inspecting institution terminal 20.

The inspection recipe providing unit 140 searches the inspection support DB 200 on the basis of the information accepted in the input window, extracts information about a procedure till starting the specified inspection after receiving the sample within from the associated inspection recipe information, and transmits the extracted information to the inspecting institution terminal 20. The inspector transmits, e.g., the attribute information of the sample with respect to the specified inspection to the inspection support server 10 according to the information displayed on the display screen of the LCD of the inspecting institution terminal 20.

The inspection recipe providing unit 140 searches the inspection support DB 200 on the basis of the attribute information, transmitted from the inspecting institution terminal 20, of the sample with respect to the specified inspection, and extracts the inspection recipe information associated with the attribute information of the sample. For example, the inspection recipe providing unit 140 extracts, as the inspection recipe information, the pre-processing procedure associated with the attribute information of the sample, the operation guide of the specified inspection equipment unit, the device recipe, the written report creation guide, and the guideline related to the specified inspection. The inspection recipe providing unit 140 transmits the inspection recipe information extracted from the inspection support DB 200 to the inspecting institution terminal 20.

The inspector of the inspecting institution A3 starts the specified inspection of the sample C1 collected by the dismantling operator A2 by using the specified inspection equipment unit "AI-SEM21a" lent out from the support operator. The specified inspection involves acquiring the captured image data of the sample C1 being image-captured under the predetermined imaging conditions and the characteristic X-rays intensity distribution data by the EDX according to the inspection recipe information provided from the inspection support server 10.

The AI processing unit 110 of the inspection support server 10 performs, as described by using FIGS. 2 and 3, the qualitative analysis and the quantitative analysis of the asbestos contained in the sample C1 by checking the captured image data of the sample C1 and the characteristic X-rays intensity distribution data against the learning data stored in the inspection support DB 200. The AI processing unit 110 reports the results of the qualitative analysis and the quantitative analysis as the evaluation results to the inspecting institution A3 (B3). Note that the AI processing unit 110 creates the evaluation results of the qualitative analysis and the quantitative analysis of the asbestos contained in the sample C1 by referring to the report information registered in the inspection support DB 200.

The inspecting institution A3 receives the report of the specified inspection results of the sample C1 with respect to the dismantling operator A2 according to the inspection recipe information provided from the inspection support server 10 (B4). The dismantling operator A2 reports the diagnosis results created based on the specified inspection result report of the sample C1, which is reported from the inspecting institution A3, to the prime contractor A1 issuing the order of the dismantling work of the building from which the sample C1 is collected (B5). The prime contractor A1 submits a notice instanced by an application for permission of the dismantling work, which is created based on the diagnosis results reported from the dismantling operator A2, to the municipality or another equivalent organization that supervises the dismantling work of the building (B6). The municipality or another equivalent organization examines the notice instanced by the application for permission on the basis of Occupational Safety and Health Act, Air Pollution Control Law, Waste Disposal Law and other equivalent laws.

(Billing Management Unit 120)

Bold broken lines B7, B8, B9 in FIG. 5 represent a flow of costs related to the specified inspection of the asbestos incidental on the dismantling work of the building. In a mode illustrated in FIG. 5, e.g., part of the cost (B7) of the dismantling work ordered to the dismantling operator A2 from the prime contractor A1 is paid as an asbestos specified inspection expenditure (B) to the inspecting institution A3. An equivalent value billed based on the contract is paid to the support operator providing the inspection support service to the inspecting institution A3.

The billing management unit 120 of the inspection support server 10 conducts the billing management corresponding to the support service providing mode, a usage count of the lent-out specified inspection equipment unit, an implementation count of the qualitative analysis and the quantitative analysis, and other equivalent data on the basis of the billing management information registered in the inspection support DB 200.

The billing management unit 120 measures, e.g., a providing count of the inspection recipe information to the inspecting institution A3, and may set the measured providing count as the usage count of the specified inspection equipment unit lent out to the inspecting institution A3. The billing management unit 120 measures a receiving count of the captured image data received from the inspecting institution A3, and may set the measured receiving count as the implementation count of the qualitative analysis and the quantitative analysis provided by the inspection support server 10. The billing management unit 120 calculates, based on the billing management information registered in the inspection support DB 200, an equivalent value of using the support service with respect to the specified inspection.

The inspection support server 10 or the computer cooperating with the inspection support server 10 claims the inspecting institution A3 to pay the equivalent value on the basis of the usage equivalent value calculated via the billing management unit 120. The support operator is enabled to claim on the equivalent value conforming to the contract form of the support service provided to each inspecting institution.

(Scheduler 130)

In FIG. 5, a lend-out period of the specified inspection equipment unit lent out to the inspecting institution A3 from the support operator is registered as schedule information in the inspection support DB 200. As illustrated in FIG. 1, the inspection support server 10 provides the plurality of inspecting institutions with the support service. The scheduler 130 of the inspection support server 10 manages the lend-out period of the specified inspection equipment unit on the basis of the schedule information per inspecting institution registered in the inspection support DB 200, and performs scheduling lend-out destinations on the basis of the managed lend-out period.

Figure 6:
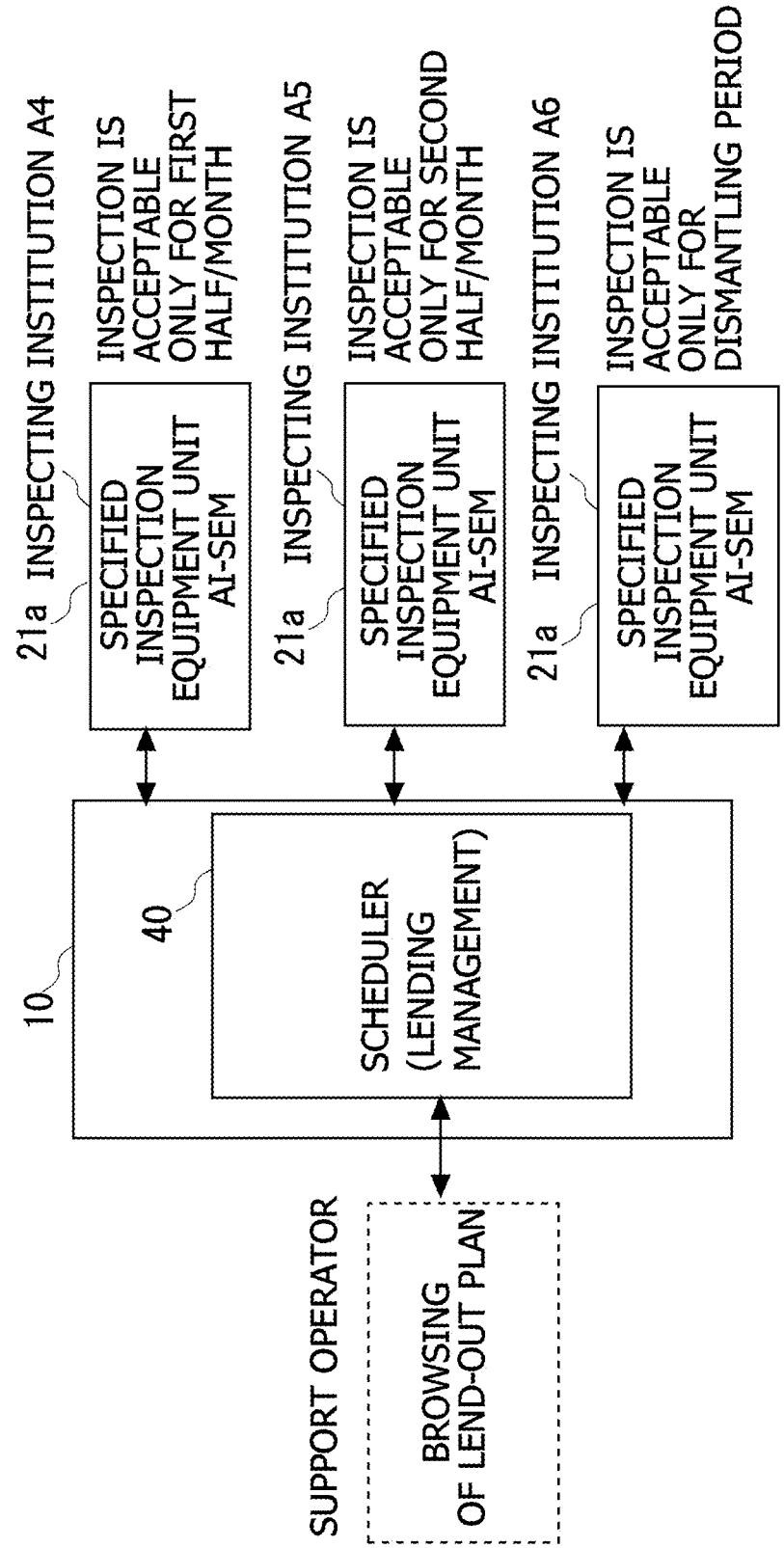
FIG. 6 is an explanatory diagram illustrating how lend-out periods are scheduled.

FIG. 6 is an explanatory diagram illustrating how the lend-out periods are scheduled. An assumption is that, for example, an accepting period of the specified inspection is limited to a first half of month on a monthly basis in an inspecting institution A4 of FIG. 6, while the accepting period of the specified inspection is limited to a second half of month on the monthly basis in an inspecting institution A5. It is also assumed that the specified inspection equipment unit is lent out to the inspecting institution A6 by being limited to a construction period (about one month) of the dismantling work. It is further assumed that there are applied the same specifications of the specified inspection equipment unit lent out to the respective inspecting institutions.

The scheduler 130 aligns operation periods (running periods) of the specified inspection equipment units of the inspecting institutions A4 through A6 on the same time base on the basis of, e.g., the schedule information registered in the inspection support DB 200. The scheduler 130 creates lend-out plans of the specified inspection equipment units to the respective inspecting institutions on the basis of the operation periods, aligned on the same time base, of the specified inspection equipment units.

For example, the scheduler 130 determines an overlapped period between the operation period of the specified inspection equipment unit by the inspecting institution A4 and the operation period by the inspecting institution A5, in which the operation periods are aligned on the same time base. The operation periods of the specified inspection equipment units are not overlapped between the inspecting institution A4 and the inspecting institution A5 in FIG. 6. The scheduler 130 determines the overlapped period between the operation period by the inspecting institution A4 and the operation period by the inspecting institution A5, and creates a lend-out plan of lending out the specified inspection equipment unit lent out to the inspecting institution A4 in the first half of month on the monthly basis to the inspecting institution A5 in the second half of month on the monthly basis.

The scheduler 130 determines the overlapped period of the operation periods, aligned on the same time base, of the specified inspection equipment units among the inspecting institutions A4, A5, A6. The scheduler 130 determines that the operation period by the inspecting institution A6 is overlapped with the operation period by the inspecting institution A4 in the first half of month on the monthly basis and is overlapped with the operation period by the inspecting institution A5 in the second half of month on the monthly basis. The scheduler 130 determines that the operation period overlapped between the inspecting institution A6 and the inspecting institution A4 is not overlapped between the inspecting institution A6 and the inspecting institution A5. Similarly, the scheduler 130 determines that the operation period overlapped between the inspecting institution A6 and the inspecting institution A5 is not overlapped between the inspecting institution A6 and the inspecting institution A4.

The scheduler 130 creates, based on the determinations made above, a lend-out plan of lending out the specified inspection equipment unit lent out to the inspecting institution A4 in the first half of month on the monthly basis to the inspecting institution A6 in the second half of month on the monthly basis, and further lending out the specified inspection equipment unit scheduled to be lent out to the inspecting institution A5 in the second half of month on the monthly basis to the inspecting institution A6 in the first half of month on the monthly basis.

The support operator browses the lend-out plans, created by the scheduler 130, of the specified inspection equipment units, and thus determines the lend-out period of the specified inspection equipment units with respect to the inspecting institutions A4, A5, A6. The support operator is enabled to share the lend-out periods of the specified inspection equipment units and to expect an improvement in working rate of the lend-out target specified inspection equipment units. The support operator is further enabled to expect a reduction in relative operating cost of the specified inspection equipment units in connection with providing the support service as compared with a case of lending out the plurality of specified inspection equipment units in parallel. The inspecting institution A5 with the specified inspection accepting period being limited to the second half of month on the monthly basis, is disabled from receiving the requests coming in the first half of month on the monthly basis. In this case also, however, the scheduler 130 is capable of adjusting the requests among the inspecting institutions in a way that allocate the request to the inspecting institution A4 with the specified inspection accepting period being limited to the first half of month on the monthly basis. It is feasible for not only the individual inspecting institution but also the whole inspecting institutions to handle the requests given from the inspection clients, and hence it is possible to satisfy demands given from the inspection clients and to improve a service level of the entire support service to be provided.

<4. Processing Flow>

Figure 7:
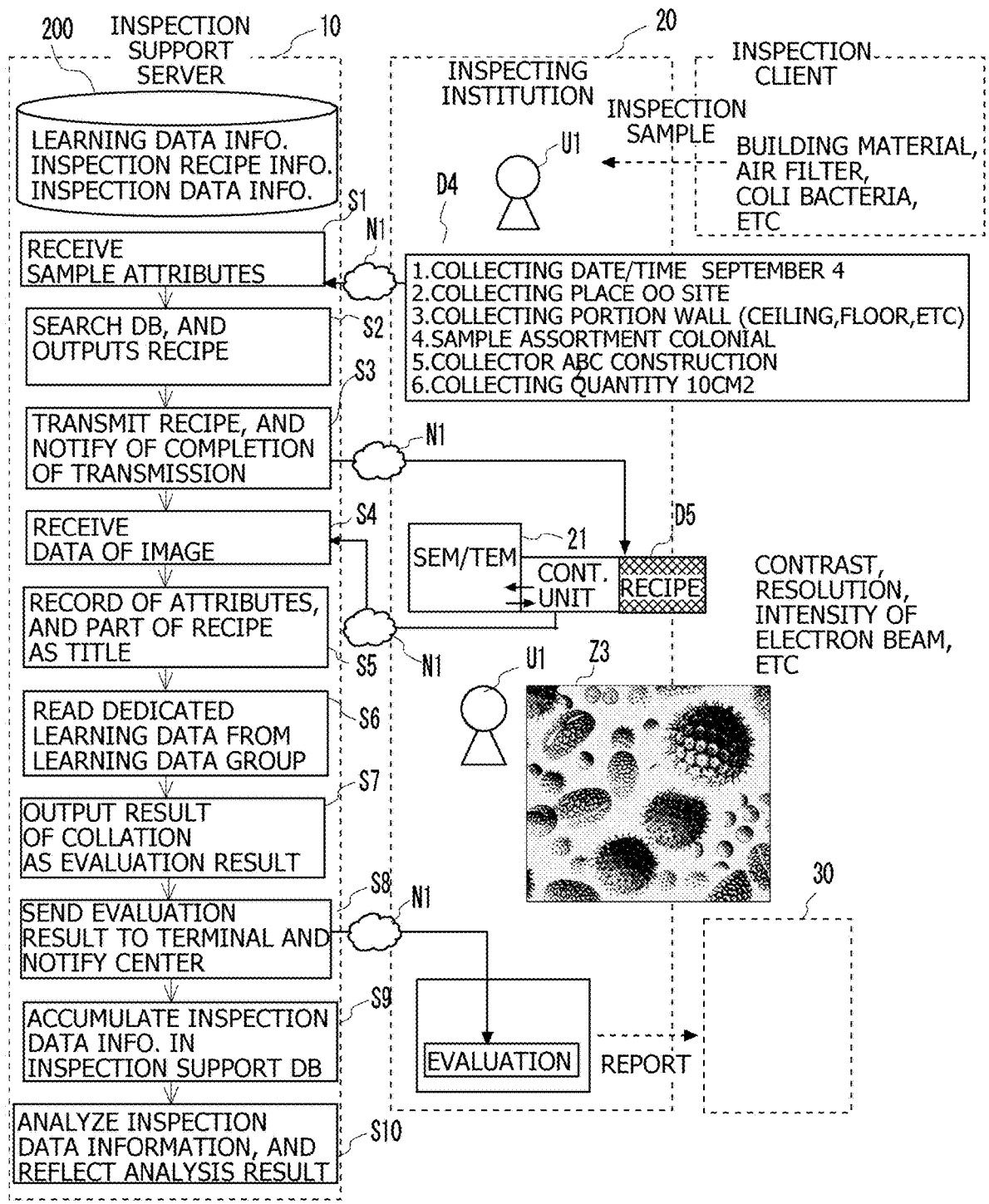
FIG. 7 is a processing flowchart illustrating one example of a qualitative analysis/quantitative analysis process according to the embodiment.

Next, the qualitative analysis/quantitative analysis process of the inspection support server 10 according to the embodiment will be described with reference to FIG. 7. FIG. 7 is a processing flowchart illustrating one example of the qualitative analysis/quantitative analysis process of the inspection support server 10. The CPU 311 or another equivalent processor reads and runs the various categories of programs and the various items of data that are stored in the auxiliary storage device 313 and the information stored in the inspection support DB 200, whereby the inspection support server 10 according to the embodiment provides processes illustrated in FIG. 7. Note that the processes illustrated in FIG. 7 are provided mainly by the processing functions of the AI processing unit 110 and the inspection recipe providing unit 140.

In FIG. 7, the inspection client submits the inspection sample related to the specified inspection to the inspecting institution. The inspection sample submitted from the inspection client is exemplified by a plurality of building materials collected from the predetermined portions (wall, floor, ceiling, etc.) of the building before starting the dismantling work, and the ventilation filter (air filter) of the ventilation equipment provided at a working place during the dismantling work. However, the inspection client is a predetermined medical institution instanced by a hospital, a health care center and a (medical) research center, in which case a lesion site of a patient is provided as the inspection sample in order to perform the specified inspection of cells and other equivalent tissues. The processing flow in FIG. 7 will hereinafter be described by taking the support model mode explained by using FIG. 5 as an explanatory example.

The inspecting institution conducts the login operation for using the support service provided by the inspection support server 10 through an operation of an inspector U1 of the inspecting institution terminal 20 connected to the specified inspection equipment unit lent out to the inspecting institution. The inspection support server 10 accepts the login via, e.g., the inspecting institution terminal 20, and displays the input window for the items of information about the contents and the purpose, the specified inspection object and other equivalent items on the display device instanced by the LCD equipped in the inspecting institution terminal 20.

The inspection support server 10 searches the inspection support DB 200 as triggered by accepting the information inputted to the input window, and transmits, to the inspecting institution terminal 20, a procedure till starting the specified inspection after receiving the sample given in the inspection recipe information associated with the inputted information. The inspector U1 transmits the attribute information of the received inspection sample to the inspection support server 10 according to the procedure displayed on the display device of the inspecting institution terminal 20. Note that the information inputted via the input window is temporarily recorded in, e.g., a predetermined area of the main storage device 312.

Attribute information D4 in FIG. 7 is one example of the pieces of attribute information of the inspection sample collected from the building before the dismantling work. The attribute information D4 is exemplified by a collecting date/time and a collecting place when collecting the inspection sample, a collecting portion within the building, a type of the sample (nomenclature of member), a collector, and a collecting quantity. It is to be noted that the inspection sample is the ventilation filter of the ventilation equipment provided at the work place during the dismantling work, in which case the attribute information is exemplified by the collecting date/time and the collecting place in the case of collecting the inspection sample, a filter assortment such as a filter manufacturer, a filter model number and a filter color, a ventilation quantity (liter/unit time) and usage time.

The inspection support server 10 receives the attribute information of the inspection sample, which is transmitted from the inspecting institution terminal 20 (S1). The received attribute information of the inspection sample is temporarily recorded in the predetermined area of the main storage device 312. The inspection support server 10 searches the inspection support DB 200 by using the attribute information of the inspection sample as a search key, thus extracting the inspection recipe information associated with the attribute information (S2). The inspection support DB 200 is searched for the attribute information D4 illustrated in FIG. 7 by using the collecting portion within the building, the sample assortment (nomenclature of member) and other equivalent items as the search key. When the inspection sample is the ventilation filter, the inspection support DB 200 is searched in a way that uses, e.g., the filter assortment such as the filter manufacturer, the filter model number and the filter color as the search key. A process in S1 executed herein by the inspection support server 10 is one example of a step of accepting the attribute information of the inspection sample with a first inspection object being analyzed. The CPU 311 of the inspection support server 10 executes the process in S1 by way of one example of a unit to accept the attribute information of the inspection sample with a first inspection object being analyzed.

The inspection recipe information extracted from the inspection support DB 200 includes the following recommended information associated with the contents and the purpose of the specified inspection, the specified inspection object, and the attribute information of the inspection sample. To be specific, the inspection recipe information is exemplified by the pre-processing procedure for analyzing the inspection object in the inspection sample, the operation guide of the specified inspection equipment unit for starting the analysis of the inspection object in the sample undergoing the pre-processing, the dedicated device recipe, the written report creation guide (template, etc.) and the guideline related to the specified inspection. The inspection support server 10 temporarily records, in the predetermined area of the main storage device 312, the inspection recipe information extracted from the inspection support DB 200 by using the attribute information of the inspection sample as the search key.

The inspection support server 10 transmits the extracted inspection recipe information to the inspecting institution terminal 20 via the network N, and notifies that the transmission of the inspection recipe information is completed (S3). Herein, processes in S2-S3 executed by the inspection support server 10 are one example of "a recipe outputting of specifying, based on attribute information of the inspection sample, first inspection recipe information associated with the first inspection object, and outputting the thus-specified first inspection recipe information to the measuring device". The CPU 311 of the inspection support server 10 executes the processes in S2-S3 by way of one example of "a recipe outputting unit to specify, based on attribute information of the inspection sample, first inspection recipe information associated with the first inspection object, and outputting the thus-specified first inspection recipe information to the measuring device". The inspection recipe information specified in the processes in S2-S3 corresponds to "the first inspection recipe information associated with the first inspection object, based on the attribute information of the inspection sample".

Upon receiving the notification of the completed transmission of the inspection recipe information, the inspector U1 displays, on the display screen of the inspecting institution terminal 20, e.g., the pre-processing procedure included in the inspection recipe information, the operation guide of the specified inspection equipment unit, and other equivalent items. The inspector U1 browses the information displayed on the display screen, and applies the pre-processing to the inspection sample according to the pre-processing procedure, the pre-processing being instanced by the grinding, the heating, the melting and the immersing in the acid solution or other equivalent solutions, and obtaining the supernatants and the infranatants by the centrifuge separation that are necessary for the specified inspection. The inspector U1 sets up the inspection sample undergoing the pre-processing in the specified inspection equipment unit and starts the specified inspection of the inspection sample in accordance with the operation guide of the specified inspection equipment unit.

The device recipe in the inspection recipe information functions to control the specified inspection equipment unit as triggered by the starting operation of the inspector U1. The captured image data of the inspection sample set up on the electron microscope, the captured image data of the inspection object specified from within the inspection sample and the characteristic X-rays intensity distribution data of the inspection object are obtained based on the control program of the electron microscope and the control program to measure the characteristic X-rays intensity distribution, which are provided by the device recipe. The captured image data and other equivalent data obtained in the specified inspection equipment unit are transmitted to the inspection support server 10 via the network N.

The specified inspection equipment unit controlled by the dedicated device recipe obtains the captured image data being image-captured under a fixed imaging condition (D5). The imaging condition (D5) includes a contrast, brightness and a resolution of the image, an intensity of electron beams, an image magnification, an image size, an image format, and other equivalent elements. The captured images Z1, Z2 in FIG. 3 are illustrated as examples of the captured images of the specified inspection sample containing the asbestos. Note that a captured image Z3 depicted in FIG. 7 is an example of the captured image of the inspection sample containing the bacteria instanced by coli bacteria, which is submitted from the hospital, the medical care center or the (medical) research center. Herein, the device recipe is one example of "a control program of a measuring device to obtain image data and element analysis data for analyzing one or more inspection objects under a predetermined condition". The fixed imaging condition stimulated in the device recipe corresponds to the "predetermined condition".

The inspection support server 10 receives the captured image data representing the whole image of the inspection sample and the characteristic X-rays intensity distribution data of the inspection object, which are acquired by the specified inspection equipment unit (S4). The inspection support server 10 temporarily records, in the predetermined area of the main storage device 312, the thus-received captured image data representing the whole image of the inspection sample, the attribute information of the inspection sample and the imaging condition included in the dedicated device recipe by being associated with each other (S5).

The inspection support server 10 searches the inspection support DB 200 by using, e.g., the attribute information of the inspection sample as the search key, and thus extracts the learning data information associated with the contents and the purpose of the specified inspection and the specified inspection object (S6). The learning data includes the information serving as the evaluation basis of the qualitative analysis and the quantitative analysis of the inspection object, which is collated by the AI process. The inspection support server 10 extracts, as the learning data information, the reference image data per type of asbestos and the characteristic X-rays intensity distribution data, which are stored in the inspection support DB 200.

The inspection support server 10 performs the processes related to the qualitative analysis and the quantitative analysis described with reference to FIGS. 2 and 3 by making the collation based on the learning data information of the inspection object that is extracted from the inspection support DB 200 (S7).

The inspection support server 10 specifies the observing portion having an image-captured shape similar to the asbestos type within the captured image by checking the captured image data of the inspection sample enlarged at a high magnification against the learning data (reference image data) per asbestos type. The observing portion within the captured image is expressed by use of two-dimensional coordinates (X, Y), in which a vertical direction is set as a Y-axis direction, while a crosswise direction is set as an X-axis direction, with an origin being, e.g., a left upper angular point of the captured image.

The inspection support server 10 checks the characteristic X-rays intensity distribution data corresponding to coordinate positions of the specified observing portion against the learning data (characteristic X-rays intensity distribution data) per asbestos type, thereby determining which asbestos type the shape being image-captured in the observing portion is classified as. The collating (checking) determination is made based on, e.g., a degree of the collation.

The inspection support server 10 applies the collation process based on the learning data to the whole image captured from the inspection sample, and counts pieces of asbestos specified as the asbestos type given from the collation with the learning data. The inspection support server 10 calculates the percentage content of the asbestos contained in the inspection sample on the basis of a count value of the asbestos counted from the whole image of the inspection sample.

Figure 8:
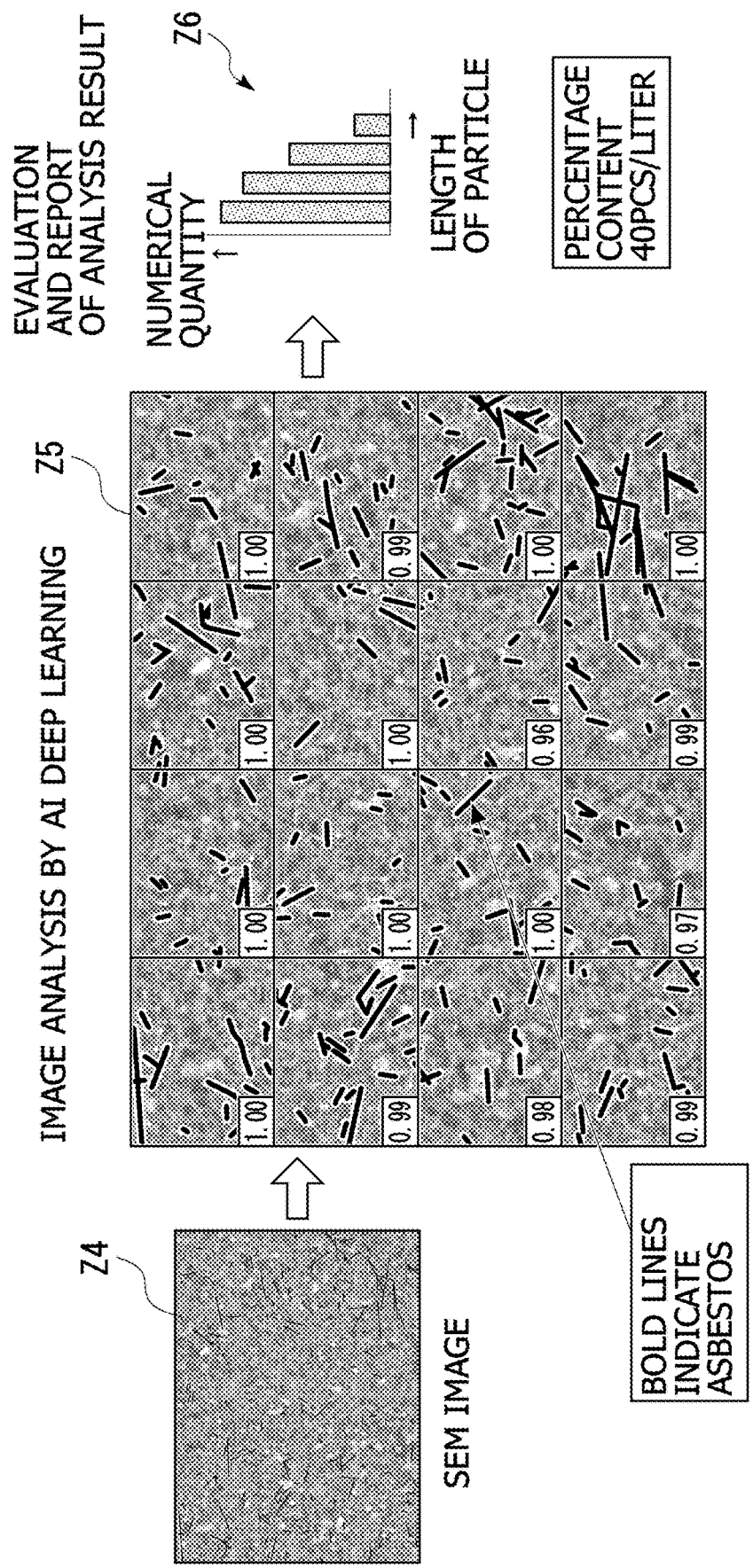
FIG. 8 is a diagram illustrating one example of results of the qualitative analysis and the quantitative analysis of the asbestos according to the embodiment.

FIG. 8 is a diagram illustrating one example of results of the qualitative analysis and the quantitative analysis of the asbestos by the inspection support server 10. FIG. 8 illustrates, as a captured image Z4, the captured image representing the whole image of the inspection sample being image-captured based on the control of the device recipe from the ventilation filter. Exemplified as a captured image Z5 is a captured image in such a state that the pieces of asbestos are specified by a deep-learning processing function applied to the captured image Z4 and provided by the AI processing unit 110 of the inspection support server 10. The specified pieces of asbestos are depicted by bold lines in the captured image Z5.

In the deep-learning processing function provided by the AI processing unit 110 of the inspection support server 10, observing target areas are determined through the collocation with the learning data in a state where the captured image Z4 with the high resolution is enlarged at the high magnification. The captured image Z5 is one example of dividing the captured image Z4 enlarged at the high magnification by 16 as the observing target areas of the asbestos.

In the captured image Z5, the AI processing unit 110 performs the collation with the learning data (reference image data) of the asbestos type per divided area, and thus specifies the image-captured portions each taking the similar shape. The AI processing unit 110 collates the characteristic X-rays intensity distribution data of the specified image-captured portions with the learning data (reference image data) of the asbestos type, thereby specifying which asbestos type the similar shape captured in the image-captured portion is classified as.

As illustrated in the captured image Z5, the inspection support server 10 executes the collating process by the deep learning based on the learning data with respect to the captured image Z4, and is thereby enabled to specify the plural pieces of asbestos different in length in a major-axis direction. Note that numeric values indicated in left lower corners of the respective divided areas represent the degrees of collation of the respective divided areas with the learning data.

The AI processing unit 110 sorts out the specified pieces of asbestos in the captured image Z5 in accordance with the length in the major-axis direction, and measures the number of pieces of asbestos (asbestos count) per sorted-out length. The length of the asbestos is specified based on, e.g., the coordinate information of the image-captured areas of the asbestos shapes.

The numeric values of the respective pieces of asbestos sorted out according to the length in the major-axis direction are displayed as a histogram representing a length distribution of the asbestos contained in the inspection sample as depicted in an image Z6 by the collating process of the deep learning of the AI processing unit 110. In the image Z6, the count value of the asbestos is indicated along an axis of ordinates, and the length (length of particle) of the asbestos in the major-axis direction is indicated along an axis of abscissas.

The inspection support server 10 calculates the percentage content of the asbestos in the inspection sample on the basis of the attribute information of the inspection sample and a total number of pieces of asbestos counted from the inspection sample. A total ventilation quantity of the ventilation equipment fitted with the ventilation filter is obtained from, e.g., the ventilation quantity (liter/unit time) included in the attribute information and the usage time of the ventilation filter (air filter) defined as the inspection sample. The percentage content of the asbestos per unit ventilation quantity (liter) is calculated by obtaining the count value of the pieces of asbestos with respect to the total ventilation quantity. Herein, processes in S6-S7 executed by the inspection support server 10 are one example of "an evaluating of making an analysis evaluation of the first inspection object of the inspection sample by collating image data and element analysis data obtained by the measuring device with reference image data and reference element analysis data of the first inspection object according to a control program of the first inspection recipe information". The CPU 311 of the inspection support server 10 executes the processes in S6-S7 by way of one example of "an evaluation unit to perform an analysis evaluation of the first inspection object of the inspection sample by collating image data and element analysis data obtained by the measuring device with reference image data and reference element analysis data of the first inspection object according to a control program of the first inspection recipe information". The learning data information extracted in the processes in S6-S7 correspond to "the reference image data and the reference element analysis data of the first inspection object".

In the process in S7 of FIG. 7, the evaluation results of the qualitative analysis and the quantitative analysis of the inspection sample are created based on the information described by using FIG. 8. The inspection support server 10 searches the inspection support DB 200 by using the contents and the purpose of the specified inspection and the attribute information of the sample as the search key, and thus extracts the report information (template) associated with the search key. The inspection support server 10 creates the evaluation results by inserting the information described in FIG. 8, the learning data (captured image data of the asbestos, the characteristic X-rays intensity distribution data) serving as the evaluation basis for the qualitative analysis and the quantitative analysis into predetermined fields of the extracted report information.

The inspection support server 10 transmits the created evaluation results to the inspecting institution terminal 20 via the network N, and notifies that the evaluation of the qualitative analysis and the quantitative analysis of the inspection sample is completed (S8). Herein, a process in S8 executed by the inspection support server 10 is one example of "an evaluation report step of reporting a result of an analysis evaluation of the first inspection object of the inspection sample". The CPU 311 of the inspection support server 10 executes the process in S8 byway of one example of "an evaluation report unit to report a result of an analysis evaluation of the first inspection object of the inspection sample".

The inspector U1 is notified of the purport that the evaluation of the qualitative analysis and the quantitative analysis of the inspection sample is completed, and displays the evaluation results transmitted from the inspection support server 10 on the display screen of the inspecting institution terminal 20. The inspector U1 displays the written report creation guide (template, etc.) included in the inspection recipe information and the guideline related to the specified inspection on the display screen of the inspecting institution terminal 20. The inspector U1 browses, e.g., the written report creation guide (template, etc.) and the guideline related to the specified inspection, and creates the written report to the inspection client on the basis of the information included in the evaluation results transmitted from the inspection support server 10. The written report about the inspection sample created by the inspector U1 is submitted to the inspection client.

After the process in S8, the inspection support server 10 accumulates, as the inspection data information, the sample attribute information recorded in the main storage device 312, and the captured image data of the whole image of the inspection sample being image-captured under the fixed imaging condition in the process in S5, in the inspection support DB 200 (S9). However, the inspection data information to be accumulated is associated with, e.g., the captured image data of the inspection object specified from the inspection sample, and with the characteristic X-rays intensity distribution data of the inspection object specified from the inspection sample. Note that the inspection data information may also be accumulated in the inspection support DB 200 by being associated with the learning data used as the basis information of the qualitative analysis and the quantitative analysis of the inspection sample or with the identifying information for identifying the learning data.

The inspection support server 10 analyzes the correlation described by using FIG. 2, and reflects the analysis result in the learning data information (S10). For instance, the captured image data, extracted from within the accumulated inspection data information and exhibiting the high correlation, of the inspection object, is reflected in the learning data information. The inspection support server 10 reflects, in the learning data information, the captured image data, exhibiting the high correlation, of the inspection object and the characteristic X-rays intensity distribution data of the inspection object, and is thereby enabled to expect the improvement in accuracy of the qualitative analysis and the quantitative analysis of the inspection object related to the specified inspection.

There are three ways of reflecting in the learning data information. The first way is that the reflection in the learning data information is done each time there comes the captured image data, exhibiting the high correlation, of the inspection object. For example, the inspection data information is reflected each time, such as when there are a small number of items of data of the accumulated inspection data information, thereby enabling the accuracy to be improved. The second way is that the captured image data, exhibiting the high correlation, of the inspection object, is saved in the inspection support server 10 till reaching a fixed quantity or a fixed period, and is then reflected in the learning data information after exceeding the fixed quantity or an elapse of the fixed period. For instance, the learning data information has some number of items of data, in which case the reflection is conducted periodically just when collecting some number of items of inspection information data without reflecting each time, and meanwhile the analysis accuracy may be further enhanced by the reflection. The third way is that the inspection data information saved so far in the inspection support server 10 is not reflected in the learning data information at all. For instance, the inspection data information inappropriate to being reflected in the learning data information and the inspection data information not aiming at being reflected in such learning data information as to be saved in the inspection support server 10 for the purpose of taking statistic data, are not reflected in the learning data information, thereby enabling the inspection accuracy to be kept.

Herein, a process in S9 executed by the inspection support server 10 is one example of "a step of accumulating, in the storage unit, image data and element analysis data acquired by the measuring device, and inspection data information associated with reference image data and reference element analysis data of the first inspection object according to a control program of first inspection recipe information". The CPU 311 of the inspection support server 10 executes the process in S9 by way of one example of "a unit to accumulate, in the storage unit, image data and element analysis data acquired by the measuring device, and inspection data information associated with reference image data and reference element analysis data of the first inspection object according to a control program of first inspection recipe information".

A process in S10 executed by the inspection support server 10 is one example of "a learning process step of learning image data and element analysis data acquired by a measuring device, and updating reference image data and reference element analysis data of the first inspection object". The CPU 311 of the inspection support server 10 executes the process in S10 byway of one example of "a unit to learn image data and element analysis data acquired by a measuring device, and update reference image data and reference element analysis data of the first inspection object".

As described above, the inspection support server 10 according to the embodiment is capable of providing the inspection recipe information related to the specified inspection on the basis of the information (the contents and the purpose of the specified inspection, the attribute information of the sample) transmitted from the inspecting institution. Based on the inspection recipe information, the inspection support server 10 is enabled to support the works such as pre-processing the inspection sample, setting up the inspection sample undergoing the pre-processing in the specified inspection equipment unit, controlling the operation of the specified inspection equipment unit, and creating the written report to the inspection client.

The inspection support server 10 is capable of providing the processing function of the deep learning based on the fixed standard (learning data) of the inspection object, which is accumulated in the inspection support DB 200, with respect to the captured image data of the inspection sample being image-captured by the specified inspection equipment unit. The inspection support server 10 is capable of providing the qualitative analysis and the quantitative analysis process of the inspection object, which enables the unique evaluation by the fixed standard (learning data). It is feasible to report, as the evaluation results, the result of the qualitative analysis and the quantitative analysis process of the inspection object, the numerical quantity of the inspection objects in the inspection sample, the size (length) of the inspection object, the distribution of the inspection objects corresponding to the size, and the percentage content. As a result, the inspection support server 10 according to the embodiment is capable of restraining the individual difference about evaluation between the inspectors, which is caused by overlooking and mis-detecting the inspection object due to the work burden on the specified inspection. The inspection support server 10 is capable of allocating the time expended for the specified inspection to other tasks, and is therefore enabled to expect the improvement in work efficiency.

The specified inspection oriented support system 100 according to the embodiment is capable of providing the support technology of improving the work efficiency by enhancing the accuracy of the specified inspection using the electron microscope.

Figure 9:
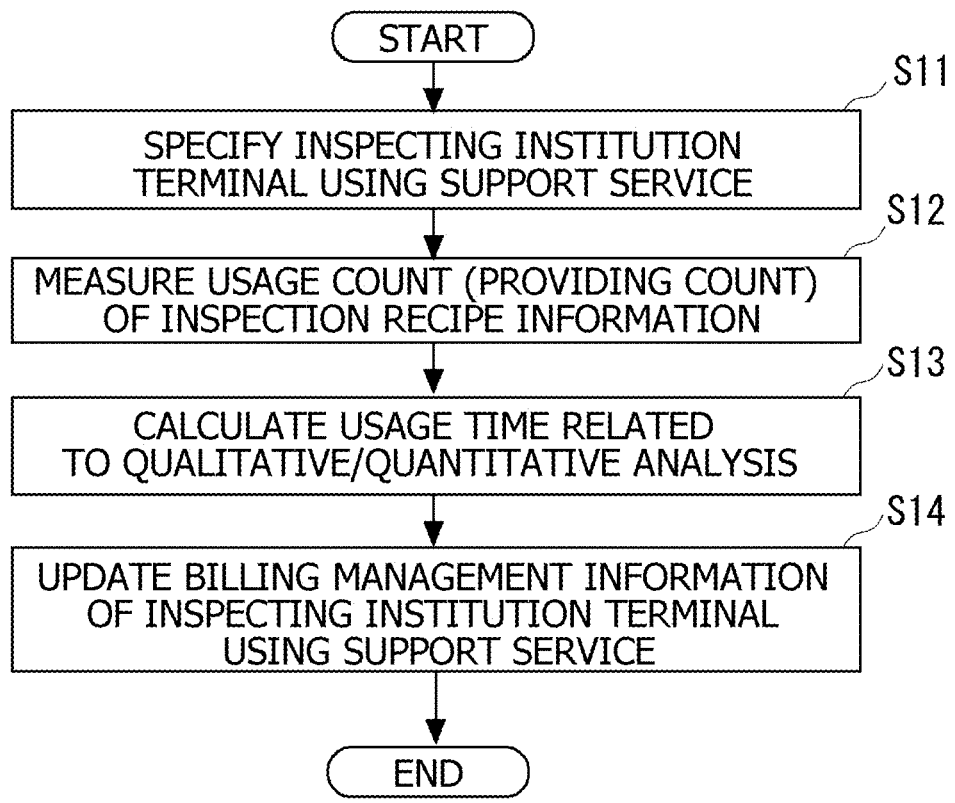
FIG. 9 is a flowchart illustrating one example of a billing management process according to the embodiment.

Next, a billing management process of the inspection support server 10 will be described with reference to FIG. 9. FIG. 9 is a flowchart illustrating one example of the billing management process of the inspection support server 10. The CPU 311 reads and executes the various categories of program and the various items of data stored in the auxiliary storage device 313, and the information stored in the inspection support DB 200, whereby the inspection support server 10 provides processes illustrated in FIG. 9. Note that the processes in FIG. 9 are provided mainly by the processing function of the billing management unit 120.

In the flowchart of FIG. 9, as timing exemplification, a start of the processing is triggered by accepting the login operation of the inspector U1 described by using, e.g., FIG. 7. The inspection support server 10 specifies the inspecting institution terminal 20 accepting the login operation (S11). The inspection support server 10 obtains the identifying information (IP address, MAC address, etc.) for uniquely identifying the inspecting institution terminal 20 when accepting, e.g., the login operation. The inspection support server 10 searches the inspection support DB 200 by using the acquired identifying information of the inspecting institution terminal 20 as the search key, and thus extracts the billing management information associated with the search key. The inspection support server 10 temporarily stores the extracted billing management information in the predetermined area of the main storage device 312 by being associated with time information.

The inspection support server 10 measures an execution count (the process in S3 of FIG. 7) of the process of providing the inspection recipe information, which is executed for the inspecting institution terminal 20 after the login operation (S12). The inspection support server 10 increments, e.g., a counter value indicating a usage count included in the billing management information. The inspection support server 10 temporarily stores the counter value of the usage count, the identifying information of the inspecting institution terminal 20 and transmission time of the inspection recipe in the predetermined area of the main storage device 312 by being associated with each other.

The inspection support server 10 calculates the usage time related to the evaluation of the qualitative analysis and the quantitative analysis after the process in S12 (S13). The inspection support server 10 records, e.g., time of receiving the captured image data after the process in S12. The inspection support server 10 further records notification time of giving the notification purporting that the evaluation of the qualitative analysis and the quantitative analysis is completed after the process in S13. The inspection support server 10 calculates the usage time related to the evaluation of the qualitative analysis and the quantitative analysis on the basis of the receiving time of the captured image data and the notification time of the notification purporting that the evaluation thereof is completed. The calculated usage time is temporarily stored in the predetermined area of the main storage device 312 by being associated with the counter value of the usage count, the identifying information of the inspecting institution terminal 20, and other equivalent items.

The inspection support server 10 updates the billing management information extracted at the processing time in S11 and associated with the inspecting institution terminal 20 (S14). The inspection support server 10 updates the billing management information extracted by using the counter value measured in the process in S12 and the usage time calculated in the process in S13, and stores the updated billing management information in the inspection support DB 200. The inspection support server 10 finishes the processes in FIG. 9 after the process in S14.

Note that the inspection support server 10 calculates the equivalent value for using the support service per inspecting institution on the basis of the billing management information stored in the inspection support DB 200 at a predetermined point of time such as an end of month. The inspection support server 10 or the computer cooperating with the inspection support server 10 claims for payment based on the calculated equivalent value per inspecting institution.

As described above, the inspection support server 10 according to the embodiment is capable of measuring the providing count of the inspection recipe information, and setting the measured providing count as the usage count of the specified inspection equipment unit lent out to the inspecting institution. The service mode provided to the inspecting institution is limited to the evaluation service of the qualitative analysis and the quantitative analysis of the inspection support server 10, in which case the usage count of the service may be set based on the providing count of the inspection recipe information. The inspection support server 10 is enabled to calculate the usage time of the inspection support server 10 with respect to the evaluation of the qualitative analysis and the quantitative analysis. As a result, the inspection support server 10 according to the embodiment makes it possible to claim for the equivalent value conforming to the contract form of the support service provided to each inspecting institution on the basis of the usage count, a utilizing count and the usage time.

Figure 10:
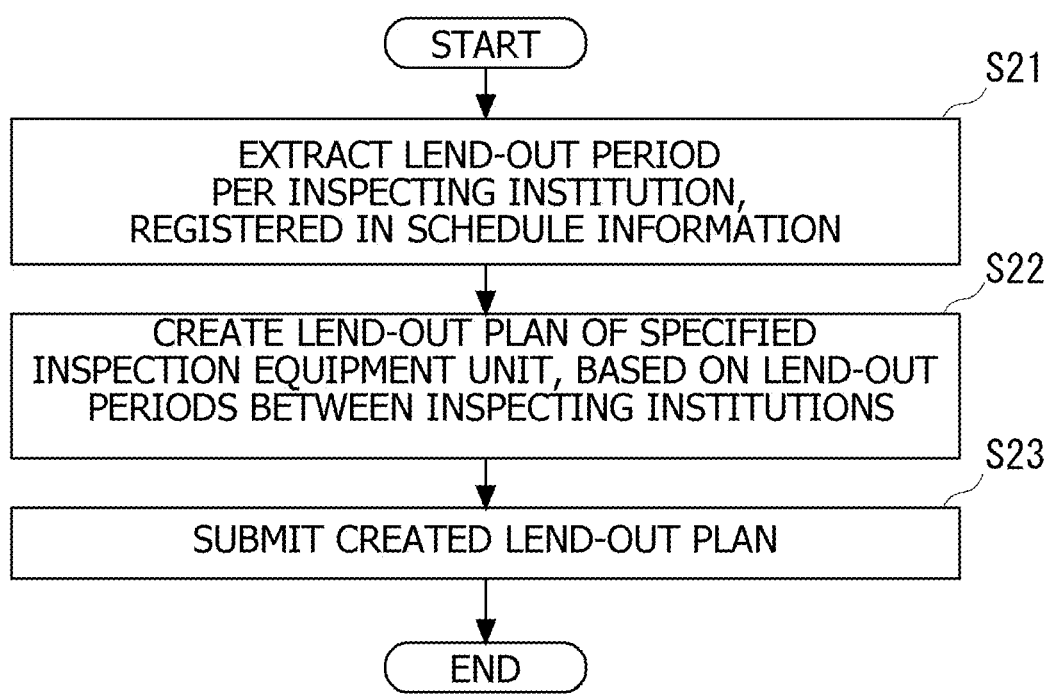
FIG. 10 is a flowchart illustrating one example of a scheduling process according to the embodiment.

A scheduling process of the inspection support server 10 will next be described with reference to FIG. 10. FIG. 10 is a flowchart illustrating one example of the scheduling process of the inspection support server 10. Processes illustrated in FIG. 10 are provided in the same way as in FIG. 9. The processes in FIG. 10 are, however, provided mainly by the processing function of the scheduler 130.

In the flowchart of FIG. 10, as timing exemplification, a start of the processing is triggered by registering, in the inspection support DB 200, the schedule information for lending out the specified inspection equipment unit. The inspection support server 10 searches the inspection support DB 200 by using the identifying information of the specified inspection equipment unit to be lent out as the search key, and thus extracts the lend-out period per inspecting institution that is registered in the schedule information (S21).

As described by using FIG. 6, the inspection support server 10 sorts out the extracted lend-out periods per inspecting institution on the same time base, and creates a lend-out plan of the specified inspection equipment unit on the basis of whether the lend-out periods are overlapped or not (S22). The overlap of the lend-out periods between the inspecting institutions is detected based on a lend-out starting date and a lend-out ending date between the inspecting institutions. The inspection support server 10 creates such a plurality of lend-out plans of the specified inspection equipment units as not to overlap the lend-out periods between the inspecting institutions.

The inspection support server 10 displays the plurality of lend-out plans for lending out the specified inspection equipment units, which are created in the process in S22, on the display device such as the LCD or on the display device equipped in the computer cooperating with the inspection support server 10 (S23). The inspection support server 10 finishes the processes in FIG. 10 after the process in S23.

As discussed above, the inspection support server 10 according to the embodiment is capable of creating the lend-out plans not causing the overlap of the lend-out periods of the specified inspection equipment units between the inspecting institutions on the basis of the schedule information registered in the inspection support DB 200. The support operator browses the lend-out plans displayed on the display device of the inspection support server 10, and determines the lend-out plan enabling the specified inspection equipment unit to be shared between or among the plural inspecting institutions. The support operator is enabled to improve the working rate of the specified inspection equipment unit to be lent out, and also to reduce the relative operating costs of the specified inspection equipment unit related to providing the support service.

«Non-Transitory Computer Readable Recording Medium»

A program configured to cause the information processing apparatus, other machines and apparatuses (which will hereinafter be referred to as the computer and other equivalent apparatuses) to attain any one of the functions, is recordable on a non-transitory recording medium readable by the computer and other equivalent apparatuses. The computer and other equivalent apparatuses are made to read and execute the program on this non-transitory recording medium, thereby enabling the function thereof to be provided.

Herein, the non-transitory recording medium readable by the computer and other equivalent apparatuses connotes a non-transitory recording medium capable of accumulating information instanced by data, programs and other equivalent information electrically, magnetically, optically, mechanically or by chemical action, the recording medium being readable from the computer and other equivalent apparatuses. Among these non-transitory recording mediums, the mediums removable from the computer and other equivalent apparatuses are exemplified by a flexible disc, a magneto-optic disc, a CD-ROM, a CD-R/W, a DVD, a Blu-ray disc, a DAT, an 8 mm tape, and a memory card such as a flash memory. A hard disc, a ROM (Read-Only Memory) and other equivalent recording mediums are given as the non-transitory recording mediums fixed within the computer and other equivalent apparatuses.

DESCRIPTION OF THE REFERENCE NUMERALS AND SYMBOLS

10 inspection support server
20, 20a, 20b, 20c inspecting institution terminal
21 specified inspection equipment unit (SEM/EDX)
21a specified inspection equipment unit (AI-SEM)
30, 30a, 30b, 30c inspection client terminal
100 specified inspection oriented support system
110 AI processing unit
111 qualitative/quantitative analysis
112 accumulation
113 reporting
114 analysis
120 billing management unit
130 scheduler
140 inspection recipe providing unit
150 operation FAQ unit
160 inspecting institution introducing unit
200 inspection support database (DB)
211 learning data
300 computer
311 CPU
312 main storage device
313 auxiliary storage device
314 communication IF
315 I/O IF
316 connection bus

What is claimed is:

1. A support system for specified inspection comprising:
a storage apparatus to store inspection recipe information including: at least learning data information containing an evaluation standard with respect to one or more inspection objects; and a control program of a measuring device to obtain data for analyzing one or more inspection objects under a predetermined condition and operation FAQ information into which information of the specified inspection oriented support services are integrated;

a processor coupled to the storage apparatus, wherein the storage apparatus stores instructions that when executed by the processor, configures the processor to:

accept attribute information of an inspection sample with a first inspection object to be analyzed;

specify first inspection recipe information associated with the first inspection object on the basis of attribute information of the inspection sample, and output the specified first inspection recipe information to the measuring device;

accept a usage request and provide the operation FAQ information read from the storage apparatus; and perform an analysis evaluation of the first inspection object of the inspection sample by collating the data obtained by the measuring device with the evaluation standard of the first inspection object according to the control program of the first inspection recipe information.

2. The support system for specified inspection according to claim 1, wherein the processor is further configured to learn the data obtained by the measuring device, and to update the reference data of the first inspection object.

3. The support system for specified inspection according to claim 2, wherein the processor is further configured to accumulate, in the storage apparatus, inspection data information assembled by associating the data obtained by the measuring device with the reference data of the first inspection object in accordance with the control program of the first inspection recipe information, and learn the data in the inspection data information accumulated in the storage apparatus, and update the reference data of the first inspection object.

4. The support system for specified inspection according to claim 1, wherein the processor is further configured to report a result of the analysis evaluation of the first inspection object of the inspection sample.

5. The support system for specified inspection according to claim 4, wherein the storage apparatus stores report format information for reporting the analysis evaluation with respect to one or more inspection objects, and wherein the processor is further configured to report the result of the analysis evaluation of the first inspection object of the inspection sample in accordance with a first report format associated with a collecting place of the inspection sample, the collecting place being included in attribute information of the inspection sample.

6. The support system for specified inspection according to claim 1, wherein the first inspection recipe information includes pre-processing procedure information with a pre-processing procedure for the inspection sample being stipulated when obtaining the data for analyzing one or more inspection objects under a predetermined condition, and wherein the processor is further configured to output the processing procedure information associated with the first inspection object by being included in the first inspection recipe information on the basis of the attribute information of the inspection sample.

7. The support system for specified inspection according to claim 1, wherein the first inspection recipe information includes any of operation guide information of the measuring device till starting obtaining the data of a predetermined standard with respect to the inspection sample after setting up the inspection sample undergoing the pre-processing for analyzing one or more inspection objects, written report creation guide information for creating a written inspection report on the basis of the analysis evaluations of one or more inspection objects of the inspection sample, and guideline information related to the inspections of one or more inspection objects of the inspection sample, and wherein the processor is further configured to output at least any of the operation guide information associated with the first inspection object, the written report creation guide information, and the guideline information by being included in the first inspection recipe information.

8. The support system for specified inspection according to claim 1, wherein the processor is further configured to measure a providing count of the first inspection recipe information to the measuring device; and a unit to measure a period for which at least the analysis evaluation of the first inspection object of the inspection sample is performed by collating the data obtained by the measuring device according to the control program of the first inspection recipe information with the data of the first inspection object.

9. The support system for specified inspection according to claim 1, further comprising, the storage apparatus storing schedule information registered with operation periods for each of the plural measuring devices, wherein the processor is further configured to create, when replacing the second measuring device with the first measuring device between the operation period of the first measuring device and the operation period of the second measuring device, such a sharing plan as to exclude an overlapped period between the operation period of the first measuring device after the replacement and the operation period of the first measuring device before the replacement.

10. The support system for specified inspection according to claim 1, wherein the processor is further configured to output the specified first inspection recipe information to the measuring device via a network.

11. A support system for specified inspection comprising:

a storage apparatus to store inspection recipe information including: at least learning data information containing reference image data serving as an evaluation standard with respect to one or more inspection objects and reference element analysis data; and a control program of a measuring device to obtain image data and element analysis data for analyzing one or more inspection objects under a predetermined condition and operation FAQ information into which information of the specified inspection oriented support services are integrated;

a processor coupled to the storage apparatus, wherein the storage apparatus stores instructions that when executed by the processor, configures the processor to:

accept attribute information of an inspection sample with a first inspection object to be analyzed;

specify first inspection recipe information associated with the first inspection object on the basis of attribute information of the inspection sample, and to output the specified first inspection recipe information to the measuring device;

accept a usage request and to provide the operation FAQ information read from the storage apparatus; and perform an analysis evaluation of the first inspection object of the inspection sample by collating the image data and the element analysis data obtained by the measuring device with the reference image data and the reference element analysis data of the first inspection object according to the control program of the first inspection recipe information.

12. The support system for specified inspection according to claim 10, wherein the processor is further configured to output the specified first inspection recipe information to the measuring device via a network.

13. A support method for specified inspection by which a computer comprising a storage apparatus to store inspection recipe information including: at least learning data information containing an evaluation standard with respect to one or more inspection objects; and a control program of a measuring device to obtain data for analyzing one or more inspection objects under a predetermined condition and operation FAQ information into which information of the specified inspection oriented support services are integrated, the computer executing:
　　accepting attribute information of an inspection sample with a first inspection object to be analyzed;
　　recipe outputting of specifying first inspection recipe information associated with the first inspection object on the basis of attribute information of the inspection sample, and outputting the specified first inspection recipe information to the measuring device;
　　accepting a usage request and providing the operation FAQ information read from the storage apparatus; and
　　evaluating of performing an analysis evaluation of the first inspection object of the inspection sample by collating the data obtained by the measuring device with the evaluation standard of the first inspection object according to the control program of the first inspection recipe information.

14. A non-transitory computer readable medium storing a program for making a computer, comprising a storage apparatus to store inspection recipe information including: at least learning data information containing an evaluation standard with respect to one or more inspection objects; and a control program of a measuring device to obtain data for analyzing one or more inspection objects under a predetermined condition and operation FAQ information into which information of the specified inspection oriented support services are integrated, execute:
　　accepting attribute information of an inspection sample with a first inspection object to be analyzed;
　　recipe outputting of specifying first inspection recipe information associated with the first inspection object on the basis of attribute information of the inspection sample, and outputting the specified first inspection recipe information to the measuring device; and
　　accepting a usage request and providing the operation FAQ information read from the storage apparatus;
　　an evaluating of performing an analysis evaluation of the first inspection object of the inspection sample by collating the data obtained by the measuring device with the evaluation standard of the first inspection object according to the control program of the first inspection recipe information.

\* \* \* \* \*